(12) United States Patent
Inaba

(10) Patent No.: US 7,983,072 B2
(45) Date of Patent: Jul. 19, 2011

(54) SEMICONDUCTOR DEVICE

(75) Inventor: Satoshi Inaba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/625,739

(22) Filed: Nov. 25, 2009

(65) Prior Publication Data

US 2010/0073996 A1    Mar. 25, 2010

Related U.S. Application Data

(62) Division of application No. 11/866,144, filed on Oct. 2, 2007, now Pat. No. 7,643,331.

(30) Foreign Application Priority Data

Oct. 3, 2006 (JP) ................................. 2006-272081

(51) Int. Cl.
*G11C 11/00* (2006.01)
(52) U.S. Cl. ..................... 365/154; 365/205; 365/189.09
(58) Field of Classification Search .................. 365/154, 365/205, 189.09, 189.05; 257/E21.661, E27.098
See application file for complete search history.

(56) References Cited

U.S. PATENT DOCUMENTS

| | | | |
|---|---|---|---|
| 5,956,269 A | 9/1999 | Ouyang et al. | |
| 6,525,403 B2 | 2/2003 | Inaba et al. | |
| 6,611,451 B1 | 8/2003 | Houston | |
| 6,795,332 B2 | 9/2004 | Yamaoka et al. | |
| 6,914,797 B2 * | 7/2005 | Ashizawa et al. | 365/145 |
| 6,924,560 B2 | 8/2005 | Wang et al. | |
| 6,977,837 B2 | 12/2005 | Watanabe et al. | |
| 7,177,177 B2 | 2/2007 | Chuang et al. | |
| 7,200,030 B2 * | 4/2007 | Yamaoka et al. | 365/154 |
| 7,403,410 B2 | 7/2008 | Burnett | |

FOREIGN PATENT DOCUMENTS

JP    2-263473    10/1990

OTHER PUBLICATIONS

Digh Hisamoto, et al., "A Folded-channel MOSFET for Deep-sub-tenth Micron Era", IEDM, IEEE, 1998, 3 Pages.
Xuejue Huang, et al., "Sub 50-nm FinFET: PMOS," IEDM, IEEE, 1999, 4 Pages.

* cited by examiner

*Primary Examiner* — David Lam
(74) *Attorney, Agent, or Firm* — Oblon, Spivak, McClelland, Maier & Neustadt, L.L.P.

(57) ABSTRACT

In one aspect of the present invention, a semiconductor device A semiconductor device may include a SRAM cell having a first inverter, a second inverter, a first transfer transistor and a second transistor, the first inverter having a first load transistor and a first driver transistor connected to the first load transistor, the second inverter having a second load transistor and a second driver transistor connected to the second load transistor, a voltage supplying circuit configured to supply a voltage to one of the terminals of the first driver transistor and one of the terminals of the second driver transistor, the voltage which is one of more than a GND voltage and less than a GND voltage.

4 Claims, 20 Drawing Sheets

|  | TRANSFER TRANSISTOR (N5,N6) | DRIVER TRANSISTOR (N3,N4) | LOAD TRANSISTOR (P1,P2) |
|---|---|---|---|
| GATE LENGTH(L) | L1(<>L2) | L2 | L2 |
| FIN WIDTH(Wfin) | Wfin1(<>Wfin2) | Wfin2 | Wfin2 |
| THE NUMBER OF PILLARS(XFIN) | ×1 | ×2 | ×1 |
| OPERATION MODE | conv.MOSFET | FD-SOI MOSFET | FD-SOI MOSFET |
| CURRENT DRIVABILITY(I) | Itr(<Idr) | Idr | Pld |

FIG. 16

| | TRANSFER TRANSISTOR (N5,N6) | DRIVER TRANSISTOR (N3,N4) | LOAD TRANSISTOR (P1,P2) |
|---|---|---|---|
| GATE LENGTH(L) | L1($>$WL2) | L2 | L2 |
| FIN WIDTH(Wfin) | Wfin1($>$Wfin2) | Wfin2 | Wfin2 |
| THE NUMBER OF PILLARS(XFIN) | ×1 | ×1 | ×1 |
| OPERATION MODE | conv.MOSFET | FD-SOI MOSFET | FD-SOI MOSFET |
| CURRENT DRIVABILITY(I) | Itr($<$Idr) | Idr | Pld |

SEMICONDUCTOR DEVICE

CROSS REFERENCE TO RELATED APPLICATION

This application is a divisional application of U.S. Ser. No. 11/866,144, filed Oct. 2, 2007, now U.S. Pat. No. 7,643,331, which claims priority under 35 U.S.C. 119 to Japanese Application No. 2006-272081, filed Oct. 3, 2006, the entire contents of both of which are incorporated herein by reference.

BACKGROUND

In a MOSFET used in a semiconductor memory device or a semiconductor device, a gate length is decreased and a thickness of the gate dielectric is decreased.

SUMMARY

Aspects of the invention relate to an improved semiconductor device.

In one aspect of the present invention, a semiconductor device A semiconductor device may include a SRAM cell having a first inverter, a second inverter, a first transfer transistor and a second transistor, the first inverter having a first load transistor and a first driver transistor connected to the first load transistor, the second inverter having a second load transistor and a second driver transistor connected to the second load transistor, a voltage supplying circuit configured to supply a voltage to one of the terminals of the first driver transistor and one of the terminals of the second driver transistor, the voltage which is one of more than a GND voltage and less than a GND voltage.

In another aspect of the invention, a semiconductor device may include A semiconductor device may include a SRAM cell having a first inverter, a second inverter, a first transfer transistor and a second transistor, the first inverter having a first load transistor and a first driver transistor connected to the first load transistor, the second inverter having a second load transistor and a second driver transistor connected to the second load transistor, a voltage supplying circuit configured to supply a voltage to a well region of the first transfer transistor and a well region of the second transfer transistor, the voltage being one of more than a GND voltage and less than a GND voltage.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIG. 16 is a table for explaining a semiconductor memory device in accordance with the second embodiment.

FIG. 20 is a table for explaining a semiconductor memory device in accordance with the second modification of the second embodiment.

DETAILED DESCRIPTION

Figure 1:
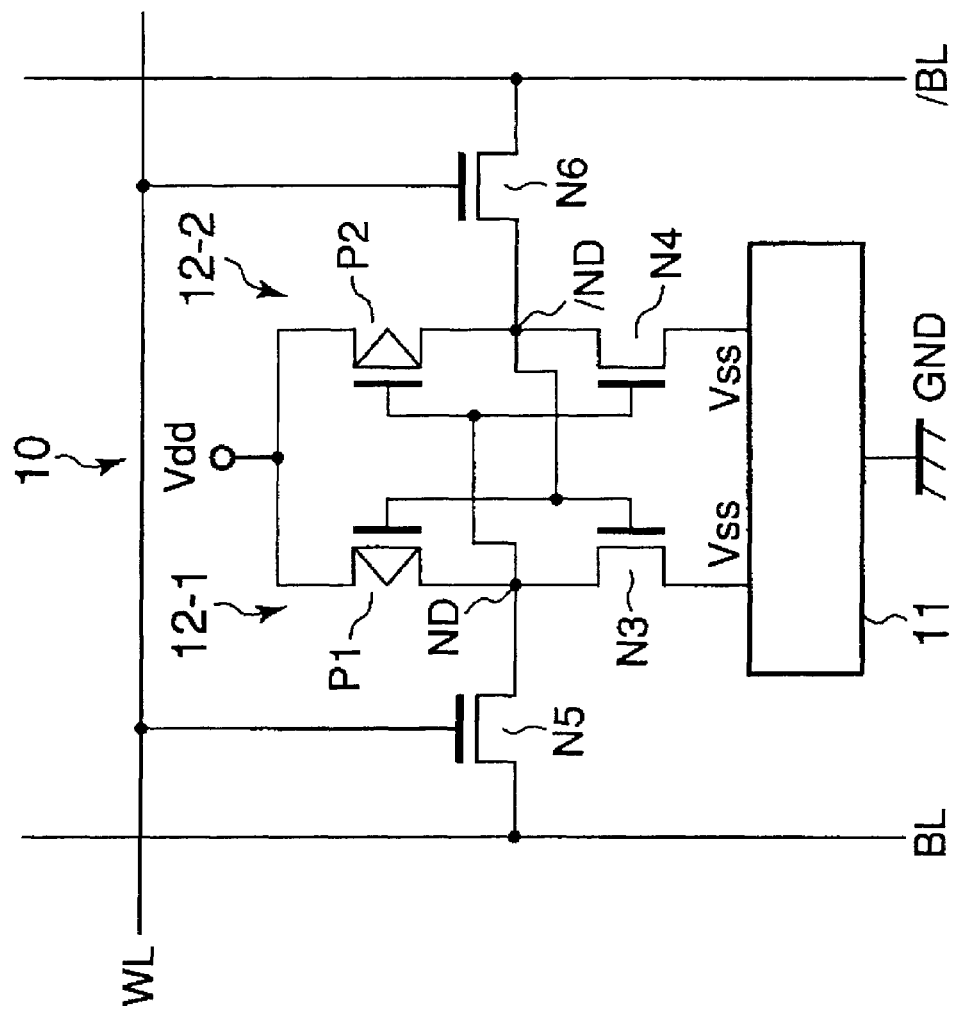
FIG. 1 is a circuit diagram of a semiconductor memory device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

Embodiments are explained in case the invention is applied to SRAM (Static Random Access Memory).

Descriptions will be provided for the following embodiments by citing a FinFET (Fin Field-effect Transistor) as a transistor. However, instead of the FinFET, a planar MOSFET (Metal Oxide Semiconductor Field-effect Transistor) or the like can be used for the present invention.

A three-dimensionally structured MIS (Metal Insulator Semiconductor) semiconductor device bas been proposed for the purpose of improving its cut-off characteristic in a short channel region where the gate length (L)<30 nm. An example of the MIS semiconductor device is a FinFET using a projection-shaped structure (a pillar or a fin) obtained by forming a semiconductor substrate to a thin strip shape. This FinFET is a transistor using the top surface and side surfaces on a pillar as a channel, and being formed in accordance with an SOI (Silicon On Insulator) substrate, for example, in a way that a pillar is firstly formed on the SOI substrate, and that then a gate electrode is formed so as to pass over the pillar.

In a case where a SRAM (Static Random Access Memory) cell is intended to be configured in accordance with FinFETs, it is difficult to set a current driving capability of each of the transistors at an adequate value. That is because it is difficult to control a threshold value of each transistor adequately, and because it is difficult to set up the channel width of each transistor arbitrarily. These problems come from a fact that the channel width of each FinFET is determined by the height of the pillar, so that it is difficult to select a channel width for each transistor on a one-by-one basis.

In a case of a FinFET using an SOI substrate, for example, the height of the pillar (or a fin) is determined by the SOI layer thickness. For this reason, it is difficult to change the channel width for each transistor. This makes it difficult to select the ratio of the current driving capability (Idr) of a driver transistor to the current driving capability (Itr) of a transfer transistor, and accordingly the SNM (Static Noise Margin) may be decreased, which can be disadvantageous for the stable operation of the SRAM cell.

First Embodiment

A first embodiment (An Example of Semiconductor Memory Including a Voltage Generating Circuit) of the present invention will be explained hereinafter.

Figure 2:
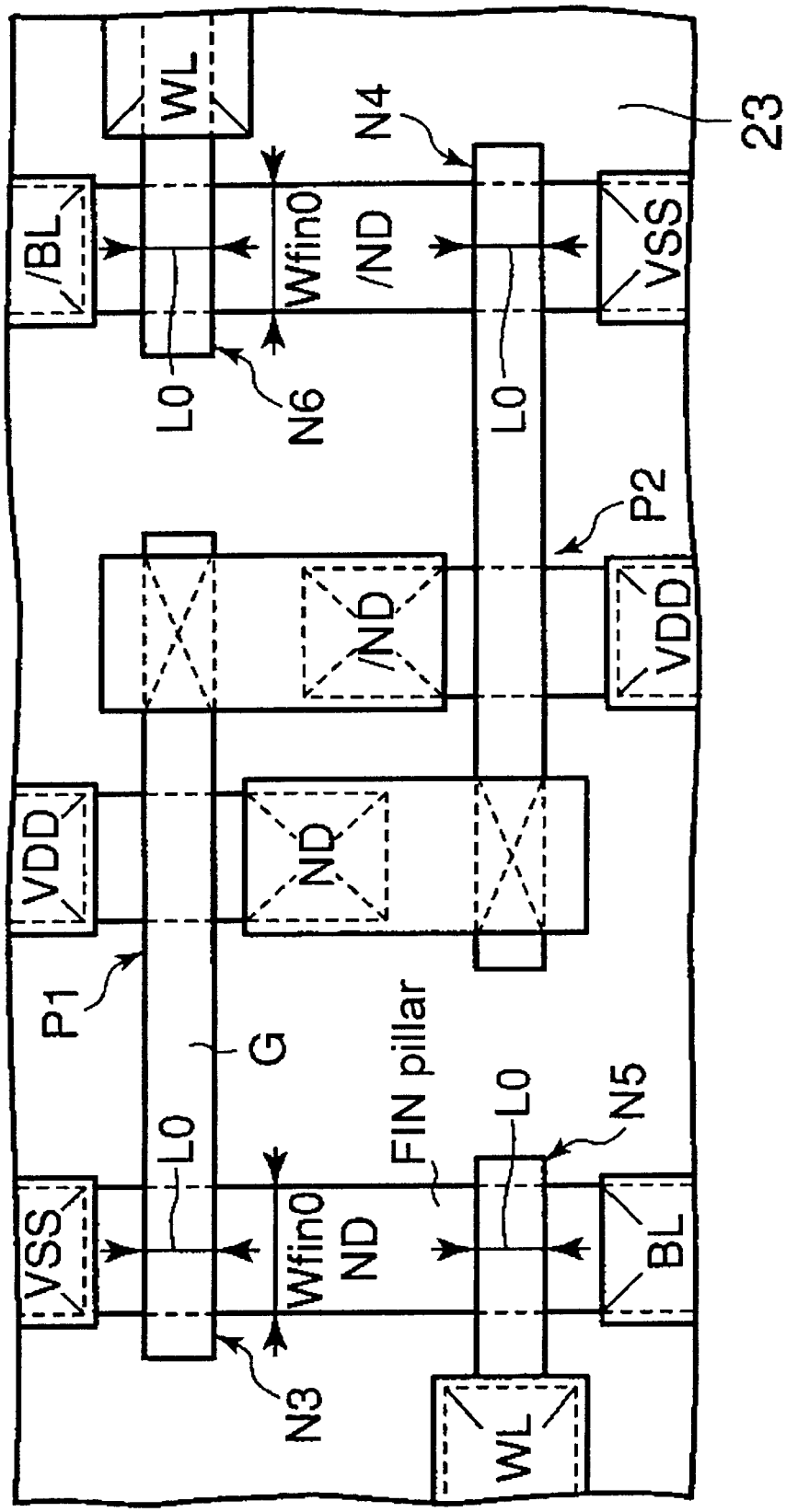
FIG. 2 is a schematic plan layout of a SRAM cell in FIG. 1.

First, descriptions will be provided for a semiconductor memory device according to a first embodiment of the present invention in accordance with FIGS. 1 to 4. FIG. 1 is a circuit diagram showing the semiconductor memory device according to this example. FIG. 2 is a diagram showing a schematic plan layout of a SRAM cell shown in FIG. 1.
<Circuit Configuration>

As shown in FIG. 1, the semiconductor memory device according to this example includes a SRAM (Static Random Access Memory) cell 10 and a voltage generating circuit 11.

The SRAM cell 10 includes MOS transistors P1 and P2 and N3 to N6. Each transistor is a FinFET using a projection-shaped structure (or pillar) obtained by forming a semiconductor substrate to a thin strip shape.

The SRAM cell 10 is configured of: transfer transistors N5 and N6; and inverter circuits 12-1 and 12-2 connected as a flip-flop so as to store data.

An end of the electric current path of the transfer transistor N5 is connected to a bit line BL whereas the other end of the electric current path thereof is connected to the node ND of the inverter circuit 12-1. The gate of the transfer transistor N5 is connected to a word line WL. An end of the electric current path of the transfer transistor N6 is connected to another bit line/BL whereas the other end of the electric current path thereof is connected to the node/ND of the inverter circuit 12-2. The gate of the transfer transistor N6 is connected to the same word line WL.

The inverter circuit 12-1 includes a load transistor (or a pull-up transistor) P1 and a driver transistor (or a pull-down transistor) N3. An end of the electric current path of the driver transistor N3 is connected to an output (Vss) of the voltage generating circuit 11 whereas the other end of the electric current path thereof is connected to an end of the electric current path of the load transistor P1 in the node ND. The gate of the driver transistor N3 is connected to the gate of the load transistor P1 and the node/ND of the inverter circuit 12-2. The other end of the electric current path of the load transistor P1 is connected to the internal voltage supply Vdd.

The inverter circuit 12-2 includes the load transistor P2 and the driver transistor N4. An end of the electric current path of the driver transistor N4 is connected to another output (Vss) of the voltage generating circuit 11 whereas the other end of the electric current path thereof is connected to an end of the electric current path of the load transistor P2 in the node/ND. The gate of the driver transistor N4 is connected to the gate of the load transistor P2 and the node ND of the inverter circuit 12-1. The other end of the electric current path of the load transistor P2 is connected to the same internal voltage supply Vdd.

Here, one of indicators of how stably the SRAM cell operates is static noise margin (Static Noise Margin: hereinafter abbreviated to "SNM"). This SNM is defined as a value representing the length of one side of a square inscribed in a butterfly curve. The larger the SNM value is, the advantageous the SNM value is for the stable operation of the SRAM cell.

Furthermore, the value representing the length of one side of the square which defines how large the SNM is determined by the β ratio. The β ratio is expressed as the ratio of the current driving capability of a driver transistor (Idr) to the current driving capability of a transfer transistor (Itr), as discussed below.

$$\beta ratio = Idr/Itr$$

The β ratio is expressed as the ratio of the current driving capability Idr (N3) of the driver transistor N3 in the SRAM cell 10 to the current driving capability Itr (N5) of the transfer transistor N5 therein, and as the current driving capability Idr (N4) of the driver transistor N4 therein to the current driving capability Itr (N6) of the transfer transistor N6 therein.

$$\beta \text{ ratio} = Idr\,(N3)/Itr\,(N5)$$
$$= Idr\,(N4)/Itr\,(N6)$$

If, for example, the current driving capabilities Idr (N3) and Idr (N4) of the driver transistors are selected to be larger than the current driving capabilities Itr (N5) and Itr (N6) of the transfer transistors, this selection makes it possible to increase the β ratios, to thus improve the SNM, and to accordingly improve the stability with which the SRAM cell operates. More specifically, the increase in the channel widths of the respective driver transistors N3 and N4, or the adequate selection of the threshold value Vt, makes it possible to increase the β ratios.

As shown in FIG. 2, the SRAM cell 10 according to the present example has a layout in which all the FinFETs constituting the SRAM cell 10 are substantially equal in gate length L0 and fin width Wfin0.
<FinFET>

Figure 3:
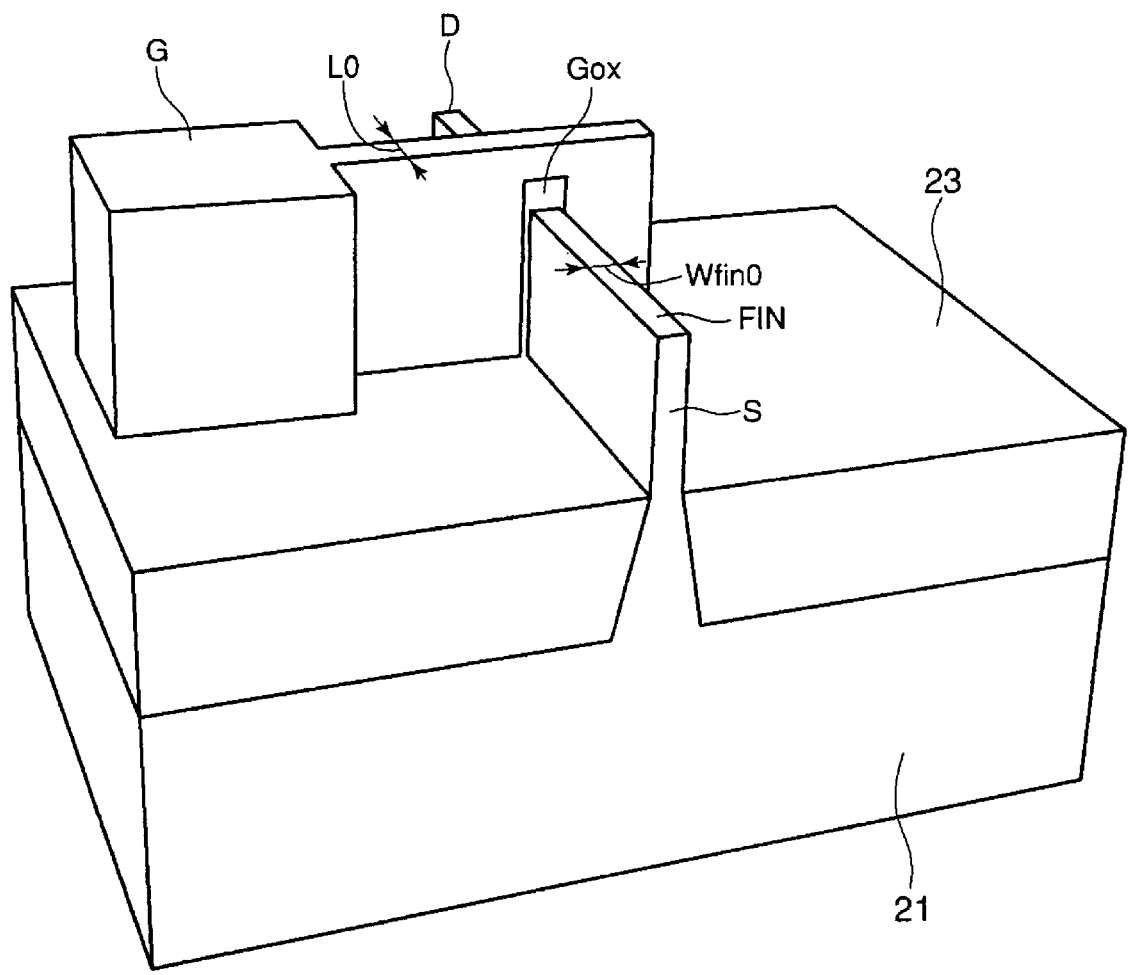
FIG. 3 is a perspective view of a driver transistor, which is provided on a bulk substrate.
Figure 4:
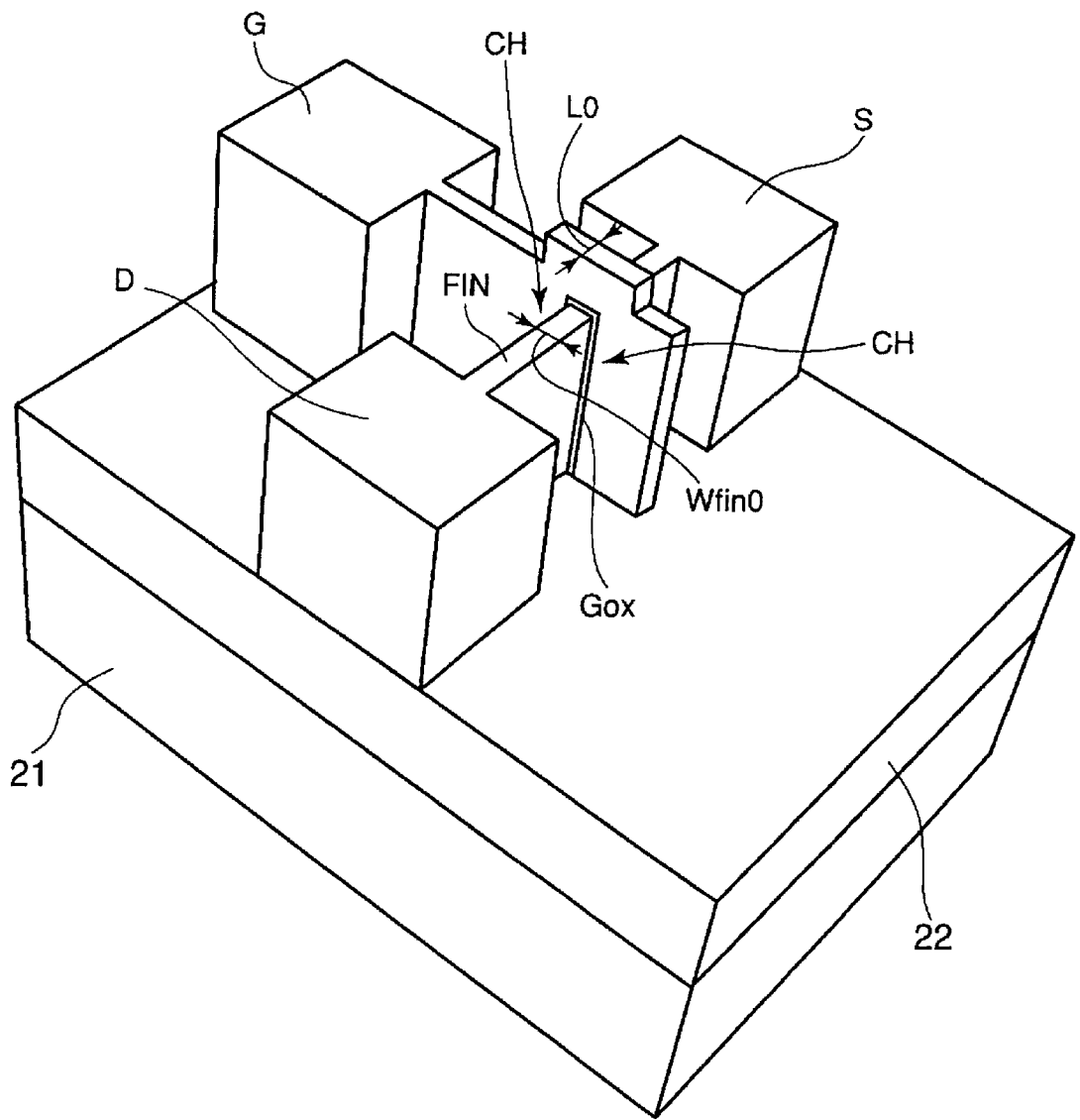
FIG. 4 is a perspective view of a driver transistor, which is provided on an SOI substrate.

Descriptions will be provided next for a configuration of one of the FinFETs in accordance with FIGS. 3 and 4. As described above, the 6 transistors P1 and P2 and N3 to N6 included in the SRAM cell 10 are FinFETs. Here, descriptions will be provided for a FinFET by citing the driver transistor N3 as an example of the FinFET.

First, descriptions will be provided for a bulk FinFET shown in FIG. 3. As illustrated, a pillar FIN to serve as an element region is formed on a p type silicon semiconductor substrate 21 by processing part of the p type silicon semiconductor substrate 21 into the pillar FIN in a way that the pillar FIN is shaped like a projection. The height of this pillar FIN is, for example, approximately 0.3 μm or lower. An element separating film 23 to serve as an element separating region is formed on the p type silicon substrate 21 at the two sides of this pillar FIN.

A gate electrode G is provided on the element separating film 23 in a way that the gate electrode G passes over the top surface and side surfaces of the pillar FIN. This gate electrode G is formed, for example, of polycrystalline silicon or the like which is doped with boron (B). The use of this polycrystalline silicon doped with boron for the gate electrode makes it possible to cause the threshold voltage to take on a value (approximately 1 V) appropriate for reducing the off-leak current. It is desirable that the concentration of boron doped into the gate electrode G may be, for example, not less than 1×1020 cm-3. In addition, it is desirable that, for the purpose of setting the threshold voltage at approximately 0.4V, this gate electrode G may be formed of a metal electrode, or a combination of a metal electrode and a polysilicon electrode, which has a work function in a vicinity of the midgap.

A gate insulating film Gox is formed on the top surface and side surfaces of the pillar FIN which are interfaces between this gate electrode G and the pillar FIN. This gate insulating film Gox is formed in a way that a part of the pillar FIN is covered with the gate insulating film Gox. The gate insulating film Gox is formed of a thermally-oxidized silicon oxide film or the like. It is desirable that the film thickness of this gate insulating film Gox may be, for example, approximately 1 nm to 3 nm. Depending on the necessity, however, the film thickness of the gate insulating film Gox may be approximately 1 nm or thinner, or approximately 5 nm.

For example, a source S is provided in a part of the pillar FIN which is in the front side of FIG. 3 whereas a drain D is provided in the other part of the pillar FIN which is in the rear side of FIG. 3. The source S and the drain D have a conduction type (n-type) which is opposite to the conduction type of the p type silicon substrate 21. The source S and the drain D are formed by self alignment by using the pattern of the gate electrode G as a mask after the gate electrode G is formed. The source S and the drain D are formed, for example, by implanting ions of an impurity, such as phosphorus (P) or arsenic (As), into the two side surfaces of the pillar FIN except for a part of the pillar FIN which is under the gate electrode G.

Descriptions will be subsequently provided for an SOI FinFET shown in FIG. 4. As illustrated, this type of FinFET is different from the foregoing bulk FinFET in that this FinFET is provided on an insulating film (SOI: Silicon On Insulator) 22 formed on the semiconductor substrate 21.

The other transistors included in the SRAM cell 10 have the same configuration as the one this SOI FinFET has. The SOI FinFET according to the present example will be described below by citing the bulk FinFET shown in FIG. 3 as an instance of the SOI FinFET.

<Electrostatic Potential of Double-gate Transistor>

Figure 5:
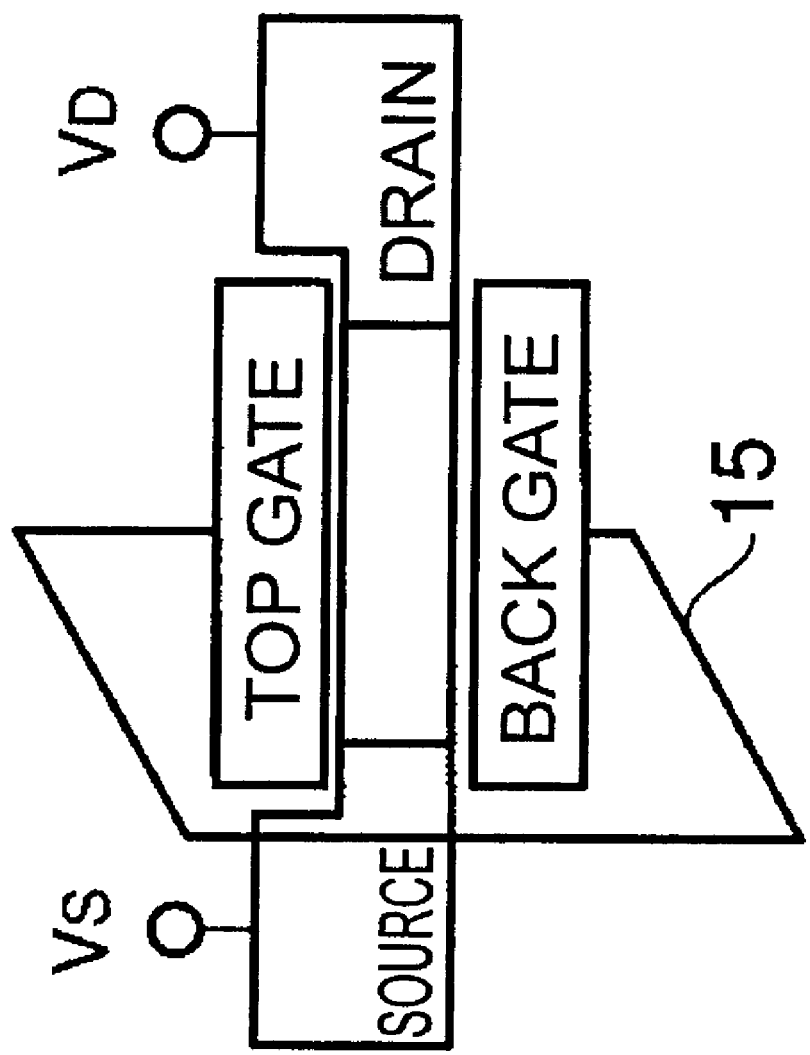
FIG. 5 is a diagram showing an electrostatic potential of double gate transistor.
Figure 6:
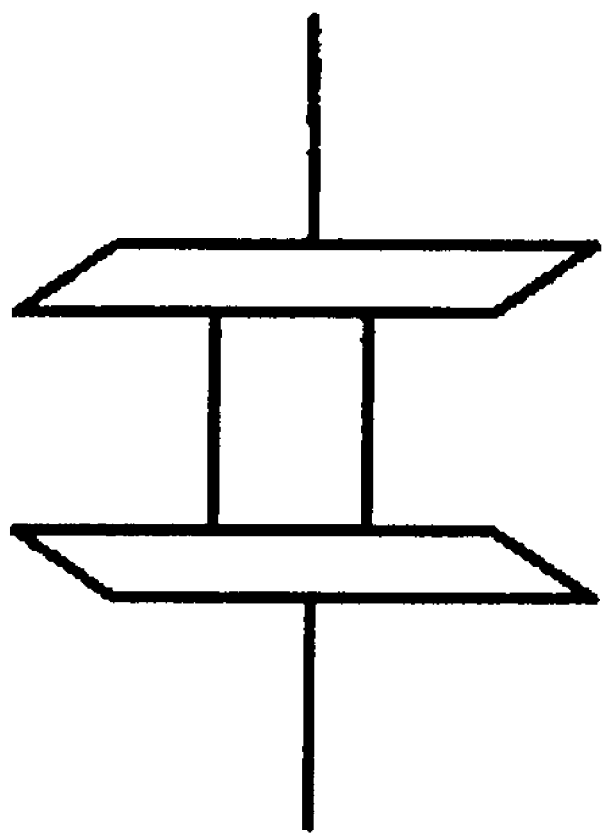
FIG. 6 is an energy band diagram taken along a plan 15 in FIG. 5.

Descriptions will be provided next for an electrostatic potential of a double-gate transistor in accordance with FIGS. 5 and 6. The FinFET is a double-gate transistor as described here.

In the case of the double-gate transistor including the FinFET, as shown in FIG. 5, an equal voltage is simultaneously applied to a top gate (or a front gate) and a back gate which serve as the gate electrodes.

For this reason, in the case of an electrostatic potential in a cross-section which cuts straight through the middle of the double-gate transistor in a direction perpendicular to its channel in FIG. 5, as shown in FIG. 6, the Fermi level is pulled in the two gate electrodes, and a channel is thus formed on the front surface portion of the side surface of each of the two electrodes.

In this respect, the FinFET shown in FIGS. 3 and 4 has a configuration causing an equal voltage to be simultaneously applied to the two gate electrodes between which the pillar FIN is interposed. In this meaning, the transistors P1 and P2 and N3 to N6 which are FinFETs according to the present example are double-gate transistors.

<Id-Vg Characteristic (Vss>0V)>

Figure 7:
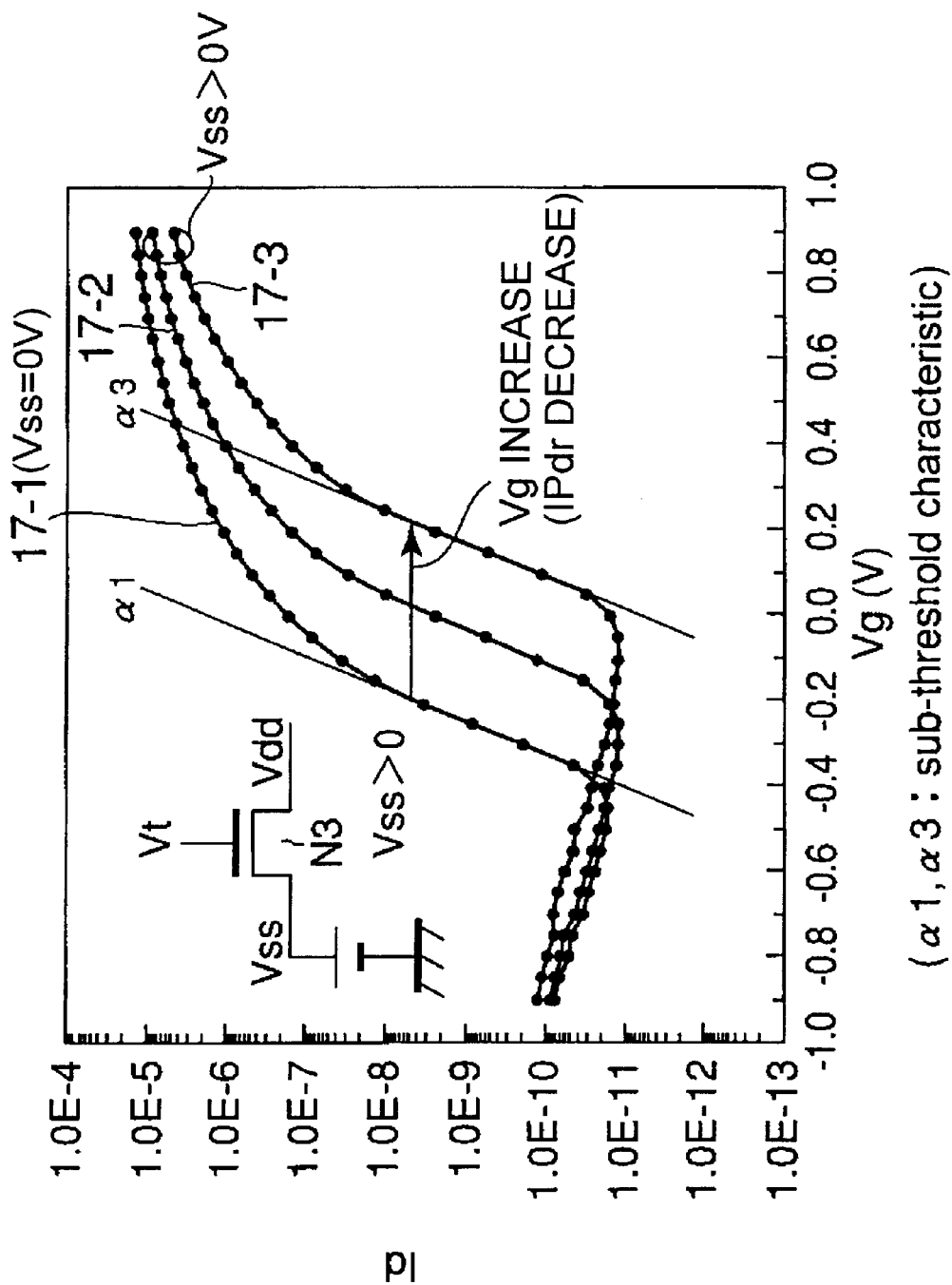
FIG. 7 is a diagram showing a threshold voltage and a drain current when an applying current is changed.

In accordance with FIG. 7, descriptions will be provided next for the Id-Vg characteristic of the drain current Id of the driver transistor N3 which is observed when a positive applied voltage Vss (Vss>0V) is applied to the source of the driver transistor N3 in accordance with the voltage generating circuit 11. The present example will be described by citing the driver transistor N3 as an instance. A continuous line 17-1 in FIG. 7 shows the Id-Vg characteristic which is observed when 0V is applied to the source of the driver transistor N3; a continuous line 17-2 shows the Id-Vg characteristic which is observed when 200 mV is applied thereto; and a continuous line 17-3 shows the Id-Vg characteristic which is observed when 400 mV is applied thereto. In this case, the well (p-well) voltage of the transistor N3 is fixed.

As shown by the continuous lines 17-1, 17-2 and 17-3, in a case where the voltage Vss applied by the voltage generating circuit 11 is sequentially changed from 0V, 200 mV to 400 mV, substantially no change is observed in sub-threshold characteristics α1 and α3. If the characteristic curves 17-1, 17-2 and 17-3 are shifted in order that the threshold voltages Vt of the respective driver transistors N3 and N4 can be increased as the positive applied voltage Vss is increased, this shift makes it possible to adjust the driving current capabilities Idr (N3) and Idr (N4).

On the other hand, in a case where, although not illustrated, a negative applied voltage Vss (Vss<0V) is applied to the source of the driver transistor N3, if the Id-Vg characteristic curves are shifted in order that the threshold voltages Vt of the respective driver transistors N3 and N4 can be decreased as the negative applied voltage Vss is increased, this shift makes it possible to increase the current driving capabilities Idr (N3) and Idr (N4).

It is learned that, in the case where the negative applied voltage Vss (Vss<0 V) is applied thereto, the increase in the applied voltage Vss makes it possible to increase the current driving capability Idr of the driver transistor N3 in this manner. On the other hand, it is possible to keep the current driving capabilities Itr (N5) and Itr (N6) of the transfer transistors N5 and N6 constant because of no change in the threshold voltages of the respective transfer transistors N5 and N6, where the current driving capabilities Itr (N5) and Itr (N6) of the transfer transistors N5 and N6 are components of the respective denominators of the β ratios.

In the case where the negative applied voltage Vss is applied thereto, if the applied voltage Vss is increased, this increase makes it possible to increase the current driving capabilities Idr (N3) and Idr (N4) which are the components of the respective numerators of the β ratios whereas this increase makes it possible to keep the current driving capabilities Itr (N5) and Itr (N6) of the transfer transistors N5 and N6 which are the components of the respective denominators of the β ratios. As a result, it is possible to increase the β ratio β1 according to the present example.

<Butterfly Curve>

Figure 8:
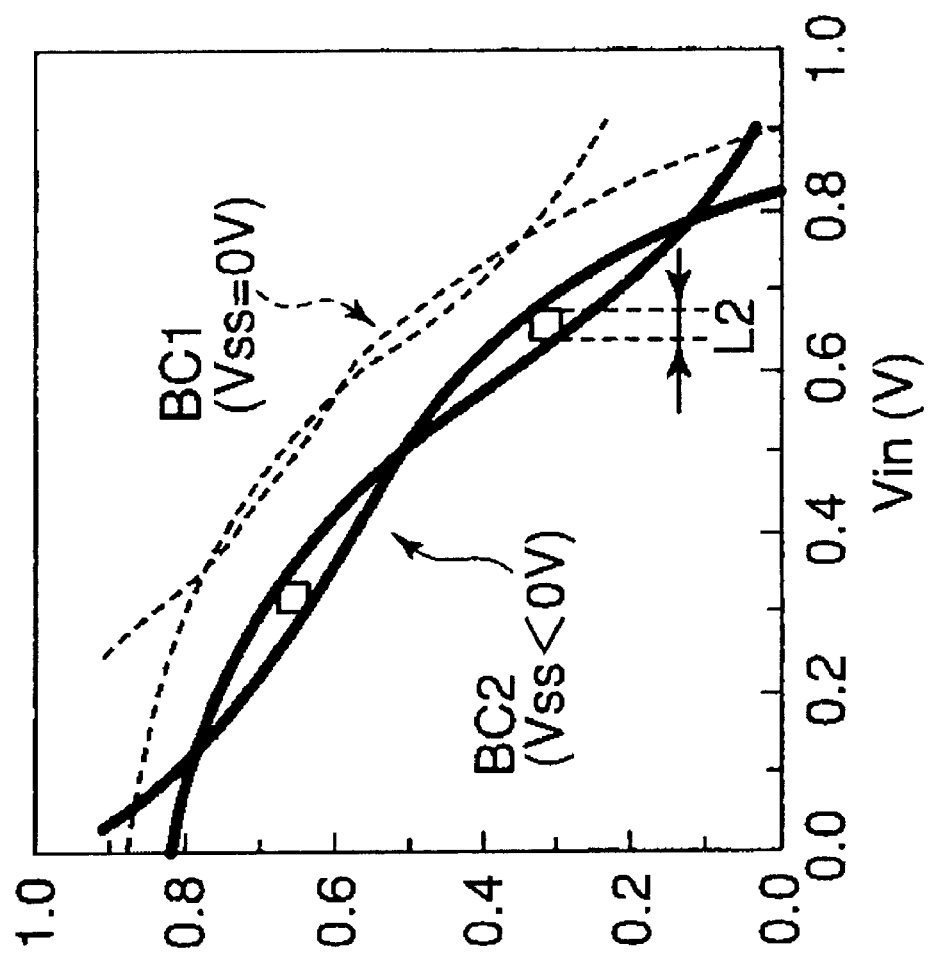
FIG. 8 is a diagram showing butterfly curve in accordance with the first embodiment.

Descriptions will be provided next for the butterfly curve of the SRAM cell 10 according to the present example in accordance with FIG. 8. The butterfly curve is obtained by plotting changes in potentials which are observed respectively in the nodes ND and /ND when the potentials in the bit lines BL and /BL are changed. The butterfly curve is an indicator of how stably the SRAM cell operates.

Broken lines BC1 in FIG. 8 represent a butterfly curve which is obtained when a voltage applied by the voltage generating circuit 11 is 0V (Vss=0V). Continuous lines BC2 in FIG. 8 represent a butterfly curve which is obtained when a voltage applied by the voltage generating circuit 11 is a negative voltage (Vss is approximately −0.2V).

As illustrated, a value (SNM: Static Noise Margin) representing the length of one side of a square inscribed in the butterfly curve represented by the broken lines BC1 is almost 0 mV or approximately 10 mV. For this reason, one may say that the SRAM cell showing the butterfly curve represented by the broken lines BC1 has a lower SNM, and that this lower SNM is disadvantageous for the stable operation of the SRAM cell. In case the Vss is 0V, the SNM is low.

On the other hand, in the case of the SRAM cell 10 according to the present example, a value L2 representing the length of one side of a square inscribed in the butterfly curve represented by the continuous lines BC2 is increased so that the value L2 is not less than 50 mV, when the voltage generating circuit 11 applies a negative applied voltage (Vss<0V) to the drive transistors.

This is because, if the negative applied voltage Vss is applied to the driver transistors in the foregoing manner, this application makes it possible to increase the current driving capabilities Idr (N3) and Idr (N4) of the driver transistors, and to accordingly improve the β ratio β1. This makes it possible to increase the SNM of the SRAM cell 10, and is advantageous for the stable operation of the SRAM cell 10.

The semiconductor memory device according to this embodiment brings about effects which will be numbered (1) and (2) below.

(1) The semiconductor memory device according to this embodiment is capable of increasing the β ratio, and of accordingly improving the SNM. This is advantageous for the stable operation of the semiconductor memory device.

The semiconductor memory device according to the present example includes the voltage generating circuit 11 for applying the applied voltage Vss to the sources respectively of the driver transistors N3 and N4.

As a result, the semiconductor memory device according to the present example is capable of shifting the characteristic curves, and of accordingly increasing the current driving capabilities Idr (N3) and Idr (N4) of the driver transistors N3 and N4 by causing the voltage generating circuit 11 to change the negative applied voltage Vss (Vss<0V) in order that the negative applied voltage Vss can be increased.

For this reason, as described below, the current driving capabilities Idr (N3) and Idr (N4) which are the components of the numerators respectively constituting the β ratios are capable of being increased whereas the current driving capabilities Itr (N5) and Itr (N6) of the transfer transistors N5 and N6, which are the components of the denominators respectively constituting the g ratios are capable of being kept constant. This makes it possible to increase the β ratio β1 according to the present example.

$$\beta 1 = Idr\ (N3)/Itr\ (N5)$$
$$= Idr\ (N4)/Itr\ (N6)$$

As a result, as shown in FIG. 8, the value representing the length of one side of the square inscribed in the butterfly curve is capable of being increased, and the SNM is accordingly capable of being improved. This is advantageous for the stable operation of the semiconductor memory device according to the present example.

In the case where, for example, the applied voltage Vss is changed up to −0.2V as shown by the butterfly curve represented by the continuous lines BC2, the β ratio L2 representing the length of one side of the square inscribed in the butterfly curve is capable of being increased so that the β ratio L2 is not less than 50 mV.

(2) The semiconductor memory device according to this embodiment is advantageous for the transistors of the SRAM cell 10 to be configured of FinFETs.

The present example brings about advantages which will be numbered 1 to 3 below, in the case where the transistors of the SRAM cell 10 are configured of FinFETs.

1. The semiconductor memory device according to this example is capable of increasing the β ratio, and of accordingly improving the SNM. This is advantageous for the stable operation of the semiconductor memory device.

In the case of prior art, when a SRAM cell is intended to be configured in accordance with FinFETs, it is difficult to set a current driving capability of each of the transistors at an adequate value. That is because it is difficult to control a threshold value of each transistor adequately, and because it is difficult to set up the channel width of each transistor arbitrarily. These problems come from a fact that the threshold width and channel width of each FinFET are determined by the height of the pillar (FIN) so that it is difficult to select a channel width for each transistor on a one-by-one basis. Particularly, in a case of a FinFET (SOI FinFET) using an SOI substrate, the height of the pillar (or a fin) is determined by the SOI layer thickness. For this reason, it is substantially difficult to cause the transistors to have their own channel widths which are different from one another.

However, the semiconductor memory device according to the present example includes the voltage generating circuit 11 for applying the applied voltage Vss to the sources respectively of the driver transistors N3 and N4.

Because of this configuration, the semiconductor memory device according to the present example is capable of increasing the current driving capabilities Idr (N3) and Idr (N4) of only the driver transistors N3 and N4, which are FinFETs, free from the height of the pillar FIN of each of the driver transistors, and to accordingly increase their β ratios. As a result, even in the case where the transistors of the SRAM cell 10 are configured of FinFETs, it is possible to increase the β ratio of the SRAM cell 10 so that the β ratio is capable of being set at an adequate value, and to accordingly improve the SNM. This is advantageous for the stable operation of the SRAM cell 10.

2. The semiconductor memory device according to the present example is advantageous for reduction of manufacturing steps and costs.

In the case of prior art, when the height of each of the FinFETs is intended to be changed for the purpose of changing its channel width, a lithographic step and an etching step, such as a RIE (Reactive Ion Etching) step, have to be carried out as separate steps for each FinFET. This increases the manufacturing step in number, and pushes up manufacturing costs.

However, the semiconductor memory device according to the present example is capable of increasing the current driving capabilities Idr (N3) and Idr (N4) of the driver transistors N3 and N4 while the height of the pillar of each of the FinFETs is kept unchanged. This makes it unnecessary that a step of changing the height of the pillar may be carried out for each FinFET. This is advantageous for reduction of the manufacturing steps and costs.

3. The semiconductor memory device according to the present example is advantageous for increase of the yield.

It may be considered that a scheme of controlling the gate length of each FinFET is also effective for adjustment of the current driving capabilities of the transistors for the purpose of increasing the β ratio of a semiconductor memory device. In this case, however, this scheme makes it difficult to obtain a sufficient β ratio from a viewpoint of the micro-sized layout for the semiconductor device. Moreover, the scheme allows FinFETs whose gate lengths are different from one another to exist in its SRAM cell. This reduces the controllability of the CD (Critical Dimension) in a photolithographic step which is carried out for forming the mutually different gate lengths, and thus decreases the yield.

By contrast, the gate length L0 and fin width Wfin0 of any one of the FinFETs constituting the SRAM cell 10 according to the present example are set equal to those of any other of the FinFETs, as shown in FIG. 2. For this reason, neither different gate lengths nor different fin widths need to be formed, and it is accordingly possible to easily control the CD in the lithographic step. Judging from these points, the semiconductor memory device according to the present example is advantageous for the increase in the yield.

The first embodiment has been described by citing the double-gate FinFET as an example of transistors constituting the SRAM cell 10. It may be noted, however, that the transistors constituting the SRAM cell 10 are not limited to double-gate FinFETs. For instance, double-gate planar transistors and single-gate planar transistors may similarly employ the present invention, and are thus capable of bringing about the same effects as the double-gate FinFETs do.

Modification of First Embodiment

Modified Example 1 (Example of Semiconductor Memory Device in which Applied Voltage Vss is of Pulse Driving Type) will be explained hereinafter.

Figure 9:
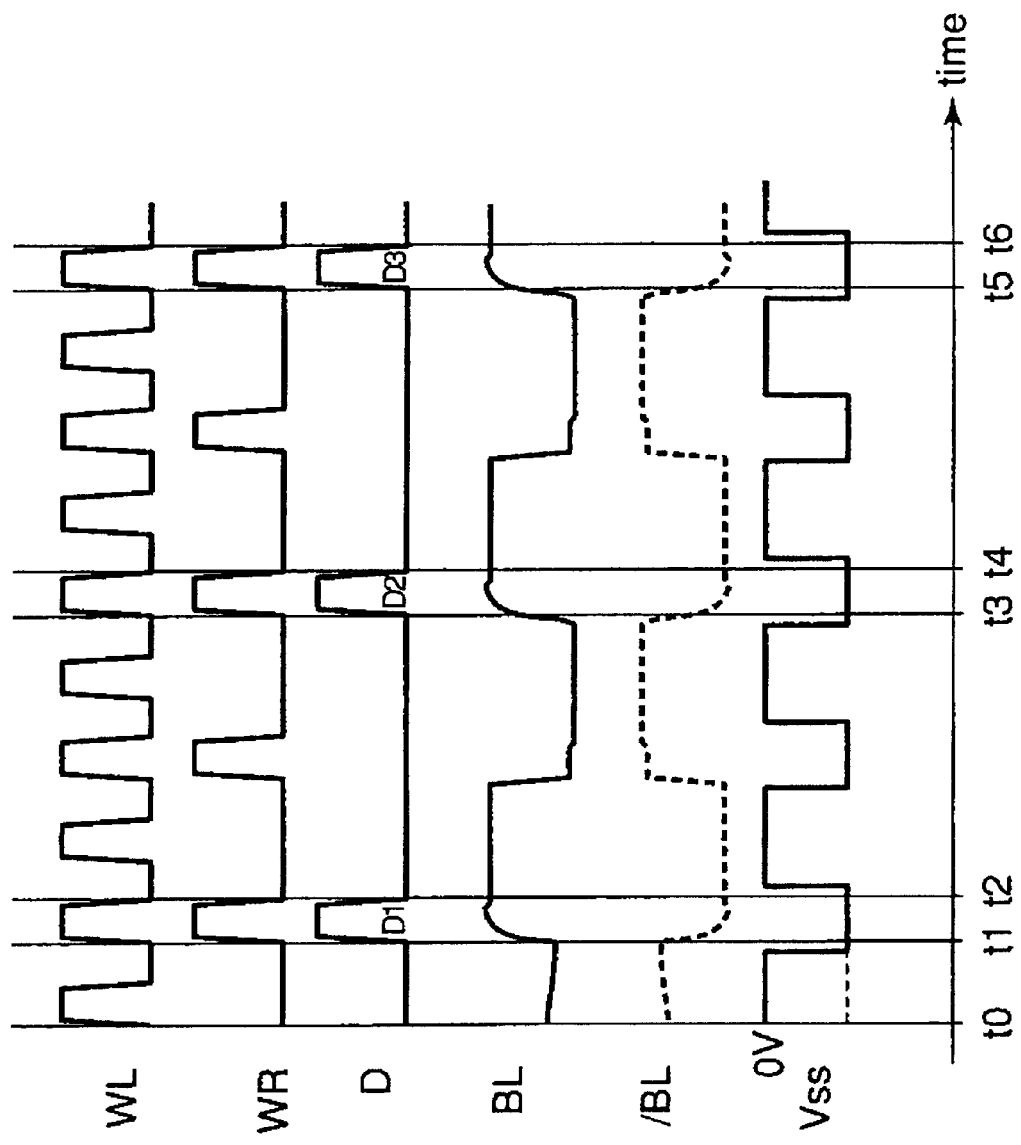
FIG. 9 is a timing chart of a semiconductor memory device in accordance with a first modification.
Figure 10:
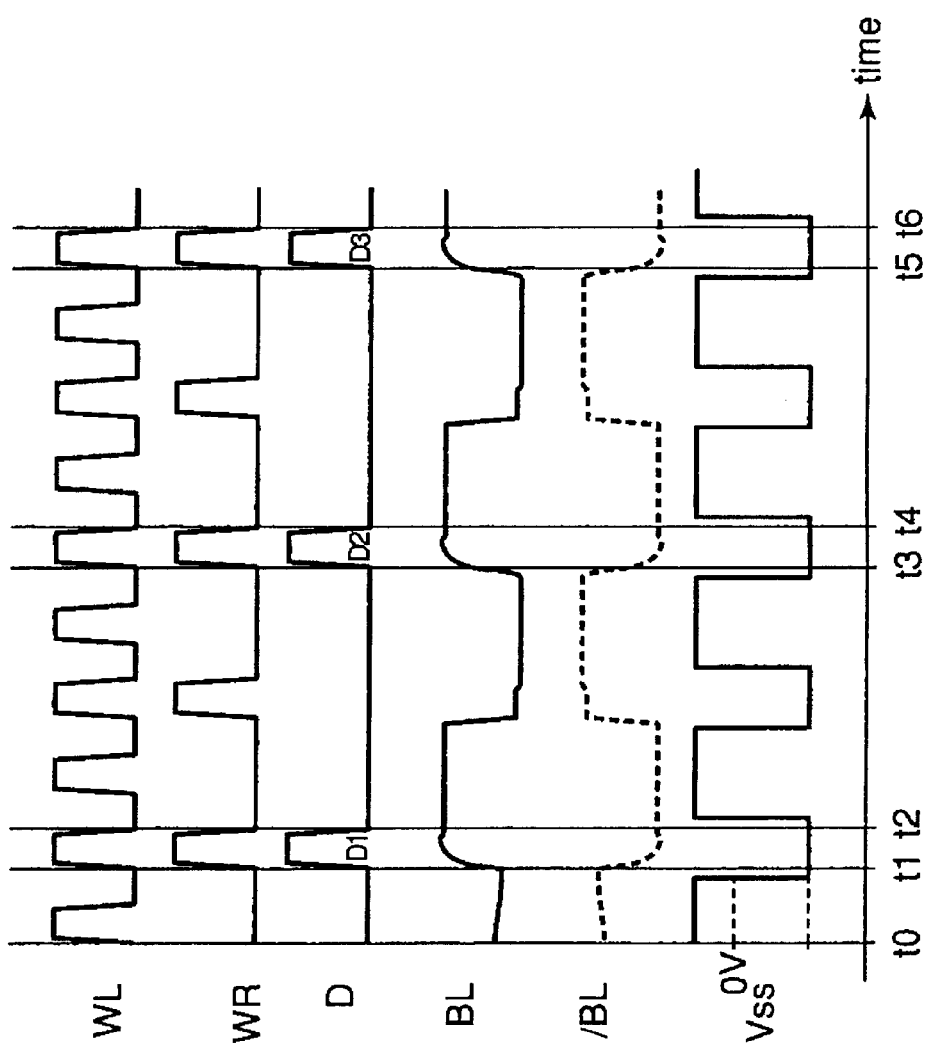
FIG. 10 is a timing chart of a semiconductor memory device in accordance with a first modification.

Descriptions will be provided next for a semiconductor memory device according to Modified Example 1 in accordance with FIGS. 9 and 10. Modified Example 1 is concerned with timings of application of the applied voltage Vss, and timings at which the voltage generating circuit is cut off. Descriptions will be provided for Modified Example 1 while omitting detailed descriptions which are the same as those for the first embodiment.

The foregoing descriptions have been provided for the first embodiment by citing the case where the applied voltage Vss is a direct current voltage. In a case where the applied voltage Vss is of a pulse driving type, however, it is possible to further improve the characteristics of the SRAM cell 10 by selecting the timing at which the applied voltage is applied to the driver transistors, and the timing at which the voltage generating circuit is cut off.

As shown in FIG. 9, First, the voltage generating circuit 11 applies a predetermined negative applied voltage Vss to the sources of the respective driver transistors N3 and N4 immediately before time t1.

Subsequently, once the SRAM cell 10 receives a write enable signal WR and input data D1 at time t1, the SRAM cell 10 goes into a stand-by mode.

Thereafter, the SRAM cell 10 operates the transfer transistors N5 and N6, and thus causes the input data D1 to be latched by the inverter circuits 12-1 and 12-2 connected as a flip-flop, hence starting a write operation.

Afterward, the SRAM cell 10 completes carrying out the write operation of writing the input data D1 at time t2.

Subsequently, the voltage generating circuit 11 returns the applied voltage Vss to 0V, which is a ground voltage GND, and is thus cut off.

After that, the SRAM cell 10 repeats carrying out the same operations, and thus performs the same write operation on data D2 and data D3.

In this manner, by applying the negative applied voltage Vss to the driver transistors immediately before the write enable signal WR and the input data D are received by the SRAM cell 10, the voltage generating circuit 11 is capable of increasing the β ratio β, and of accordingly improving the SNM, while carrying out the write operation. As described above, the timings at which the negative applied voltage Vss is applied to the driver transistors are time sufficiently but immediately before times t1, t3 and t5 at each of which the write enable signal WR and the corresponding input data D1, D2 or D3 are received by the SRAM cell 10. For this reason, each time the SRAM cell 10 comes out of the stand-by mode, the SRAM cell 10 is capable of writing the corresponding data D1, D2 or D3 with the current driving capabilities Idr (N3) and Idr (N4) of the driver transistors N3 and N4 improved.

In addition, each time the write enable signal WR and the input data D fall, the voltage generating circuit 11 returns the applied voltage Vss to 0V which is the ground voltage GND, and is thus cut off, immediately after the fall. In this manner, timings at which the voltage generating circuit 11 is cut off are time sufficiently but immediately after times t2, t6 and t10 at each of which the write enable signal WR and the corresponding input data D1, D2 or D3 fall. For this reason, each time the SRAM cell 10 completes carrying out a write operation, the voltage generating circuit 11 increases the threshold voltages Vt of the respective transfer transistors N5 and N6, and thus decreases the current driving capabilities Idr (N3) and Idr (N4). This scheme makes it possible to prevent the leakage current which would otherwise take place. This is advantageous for reduction in power consumption.

In the case where the applied voltage Vss is of the pulse driving type in this manner, it is desirable that, as described above, the applied voltage Vss may be applied to the driver transistors at its corresponding predetermined timings whereas the voltage generating circuit may be cut of at its corresponding predetermined timings.

Furthermore, in the case where the applied voltage Vss is of the pulse driving type, it is also possible to apply the applied voltage Vss to the driver transistors, and to cut off the voltage generating circuit, with timings as shown in FIG. 10. As illustrated, this case is different from the case shown by FIG. 9 in that, instead of changing the applied voltage Vss between the predetermined negative voltage and 0V, which is the ground level, as shown in FIG. 9, a positive applied voltage Vss is applied to the driver transistors after the write operation is completed.

In this case, the threshold values of the driver transistors N3 and N4 are capable of being made larger after the write operation is completed, if the SRAM cell 10 is configured in accordance with FinFETs as in the case of the present example. This is more advantageous for reduction in power consumption. That is because, when the positive applied voltage Vss is applied to the sources of the respective driver transistors N3 and N4, which are FinFETs, this voltage application makes it possible to substantially increase the threshold values of the respective driver transistors N3 and N4.

On the other hand, while the write operation is being carried out, it is possible to improve the SNM by similarly applying the negative applied voltage Vss to the driver transistors N3 and N4.

Incidentally, the circuit configuration and layout configuration of the semiconductor memory device according to Modified Example 1 are the same as those of the semiconductor memory device according to the first embodiment. For this reason, detailed descriptions have been omitted with respect to the circuit configuration and layout configuration of the semiconductor memory device according to Modified Example 1.

As described above, the semiconductor memory device according to Modified Example 1 can bring about effects which are the same as the foregoing effects numbered (1) and (2). In addition, the semiconductor memory device according to Modified Example 1 can bring about an effect which will be numbered (3) below.

(3) The semiconductor memory device according to Modified Example 1 is advantageous for reduction in power consumption.

As shown in FIG. 9, the voltage generating circuit 11 according to the present example applies the negative applied voltage Vss to the driver transistors when the SRAM cell 10 is going to receive the write enable signal WR and the input data D. This voltage application scheme makes it possible to increase the β ratio β1, and to accordingly improve the SNM, while the write operation is being carried out.

Timings at which the voltage generating circuit 11 applies the negative applied voltage Vss to the driver transistors are time sufficiently but immediately before times t1, t3 and t5 at each of which the write enable signal WR and the corresponding input data D1, D2 or D3 are received by the SRAM cell 10. This makes it possible to write the data D1, data D2 and data D3 with the current driving capabilities Idr (N3) and Idr (N4) of the driver transistors N3 and N4 improved from their stand-by mode.

In addition, each time the write enable signal WR and the input data D fall, the voltage generating circuit 11 returns the applied voltage Vss to 0V, which is the ground voltage GND, and is thus cut off, immediately after the fall. This scheme makes it possible to increase the threshold voltages Vt of the respective transfer transistors N5 and N6, to thus decrease the current driving capabilities Idr (N3) and Idr (N4), and to accordingly prevent the leakage current which would otherwise take place. As a result, this is advantageous for reduction in power consumption.

Timings at which an applied voltage Vss, which is the ground voltage GND, is applied to the driver transistors are time sufficiently and immediately after time t2 at which the write enable signal WR and the input data D1 fall, time sufficiently and immediately after time t6 at which the write enable signal WR and the input data D2 fall, and time sufficiently and immediately after time t10 at which the write enable signal WR and the input data D3 fall. This scheme reduces the current driving capabilities Idr (N3) and Idr (N4) after the write operation is completed. This makes it possible to prevent the leakage current which would otherwise take place. This is advantageous for reduction in power consumption.

In the case shown in FIG. 10, the voltage generating circuit 11 applies the positive applied voltage Vss to the driver transistors after the write operation is completed.

This voltage application makes it possible to make the threshold values of the driver transistors N3 and N4 larger after the write operation is completed. For this reason, this is more advantageous for reduction in power consumption.

In this case, the threshold values of the driver transistors N3 and N4 are capable of being made substantially larger, if the driver transistors are configured in accordance with FinFETs. This is more advantageous for reduction in power consumption. In other words, the configuration of the SRAM cell 10 in accordance with FinFETs is more advantageous for reduction in power consumption.

Second Embodiment

Second Embodiment (Example of Semiconductor Memory Device Including Substrate Bias Generating Circuit) will be explained hereinafter.

Descriptions will be provided next for a semiconductor memory device according to a second embodiment in accordance with FIGS. 11 to 15. This embodiment is concerned with an example of the semiconductor memory device including a substrate bias generating circuit. Descriptions will be provided for the semiconductor memory device according to the second embodiment while omitting detailed descriptions which are the same as those for the first embodiment.
<Circuit Configuration and Layout>

Figure 11:
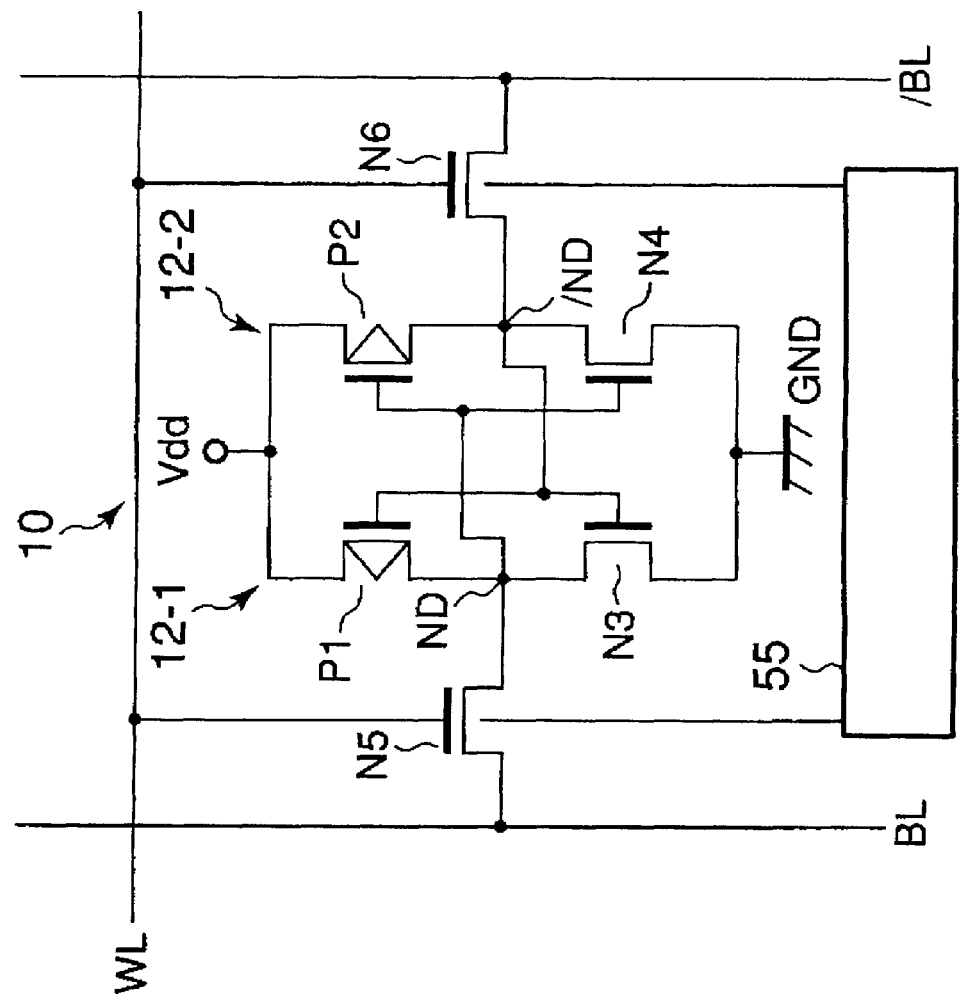
FIG. 11 is a circuit diagram of a semiconductor memory device in accordance with a second embodiment.

As shown in FIG. 11, the circuit configuration of a semiconductor memory device according to the present example is different from the circuit configuration of the semiconductor memory device according to the first embodiment in that a substrate bias generating circuit 55 for applying a substrate voltage Vsub of the semiconductor substrate to the well regions of the respective transfer transistors N5 and N6. Descriptions will be provided for transistors P1 and P2 and N3 to N6 constituting the SRAM cell according to the present example by citing the bulk FinFET shown in FIG. 3 as an instance of the transistors.

Figure 12:
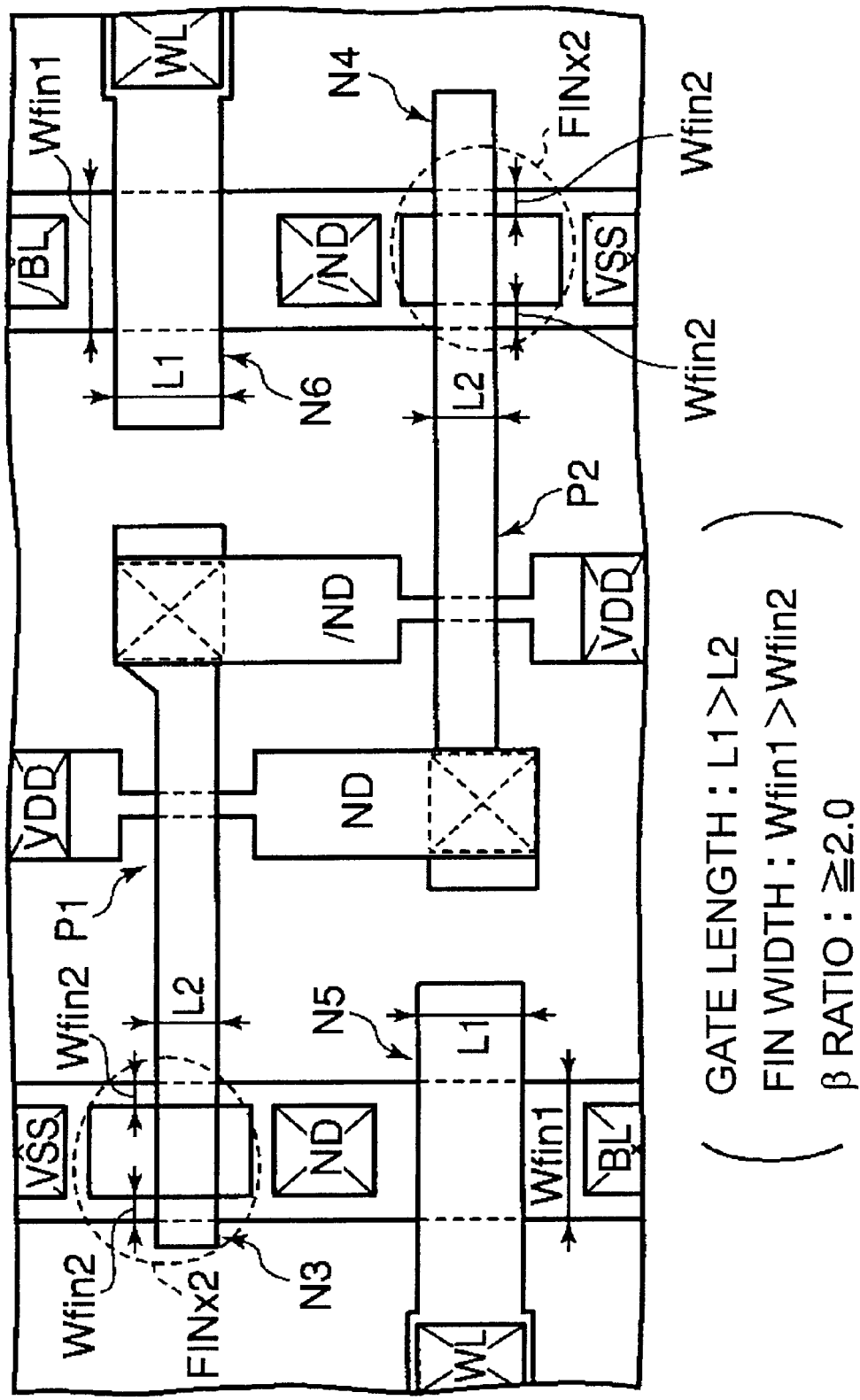
FIG. 12 is a schematic plan layout of a SRAM cell in FIG. 11.

As shown in FIG. 12, the layout of the SRAM cell 10 according to the present example is different from the SRAM cell 10 according to the first embodiment in the following points.

First, the gate length L1 of the transfer transistors N5 and N6 is set larger than the gate length L2 of the driver transistors N3 and N4 and the load transistors P1 and P2 (L1>L2).

The fin width Wfin1 of the transfer transistors N5 and N6 is set longer than the fin width Wfin2 of the driver transistors N3 and N4 and the load transistors P1 and P2 (Wfin1>Wfin2).

In addition, the number of pillars (FIN) of each of the driver transistors N3 to N4 is two (FIN×2).

Figure 13:
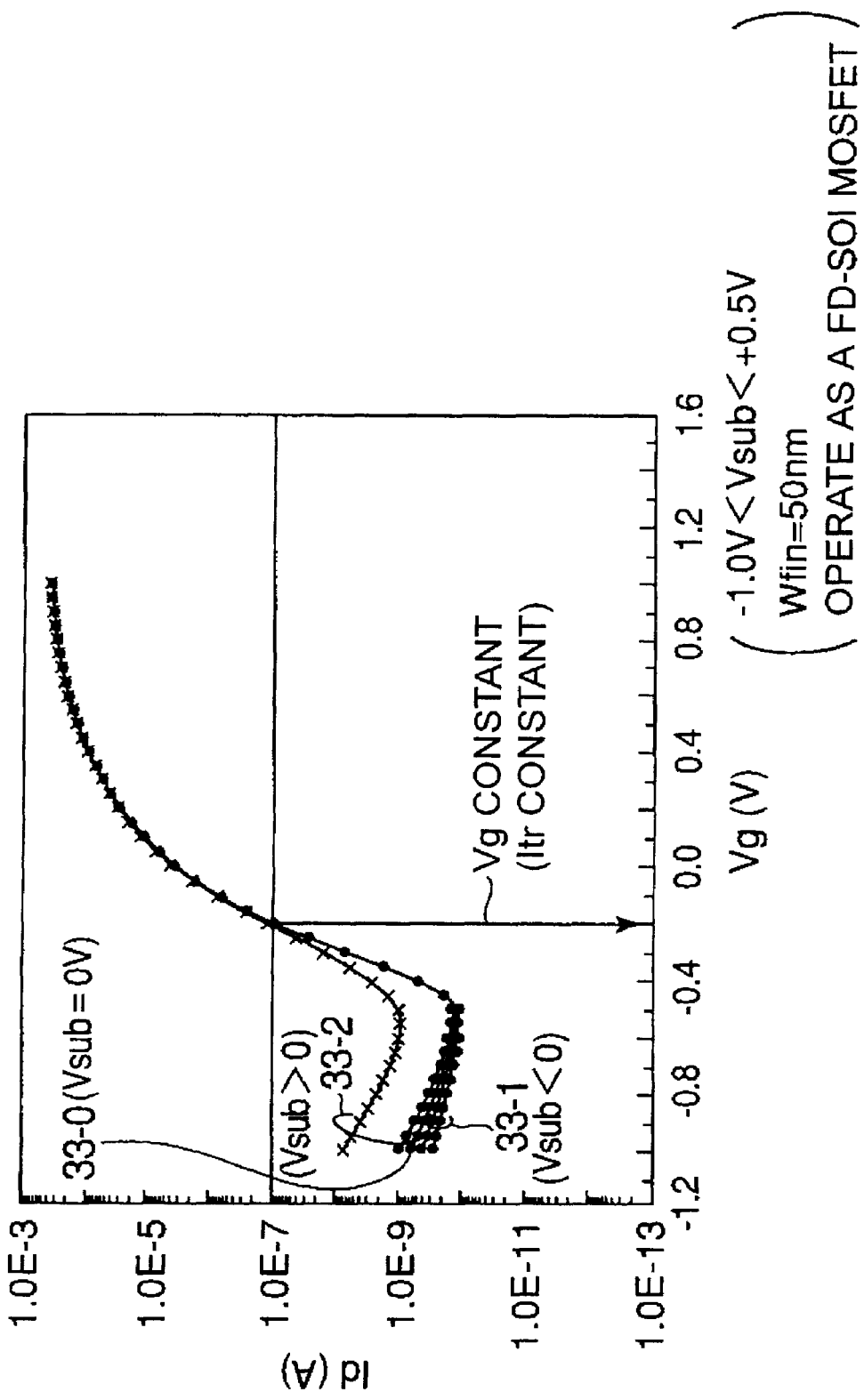
FIG. 13 is Id-Vg characteristic diagram in case a width of FIN is small.
Figure 14:
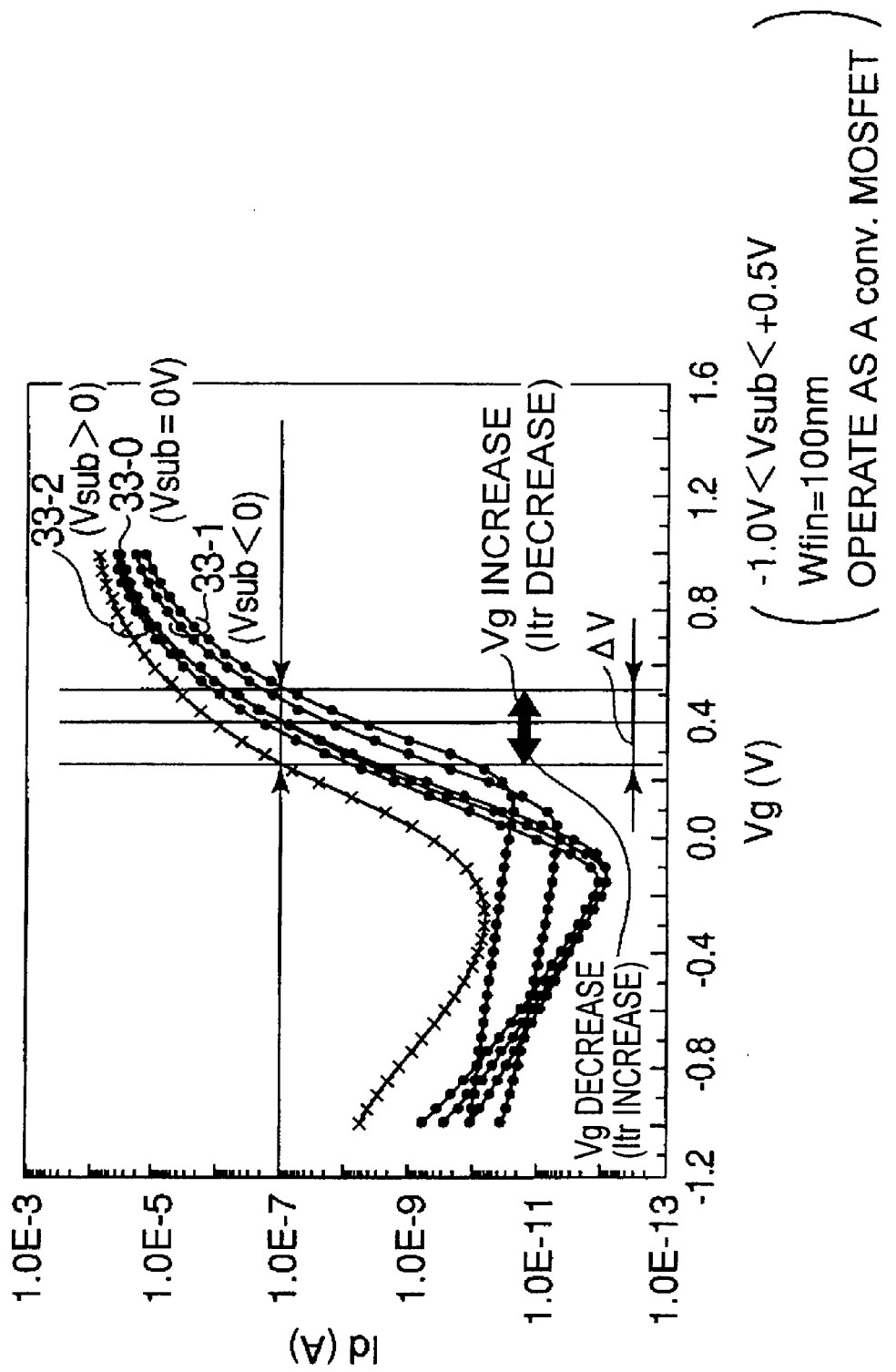
FIG. 14 is Id-Vg characteristic diagram in case a width of FIN is large.
Figure 15:
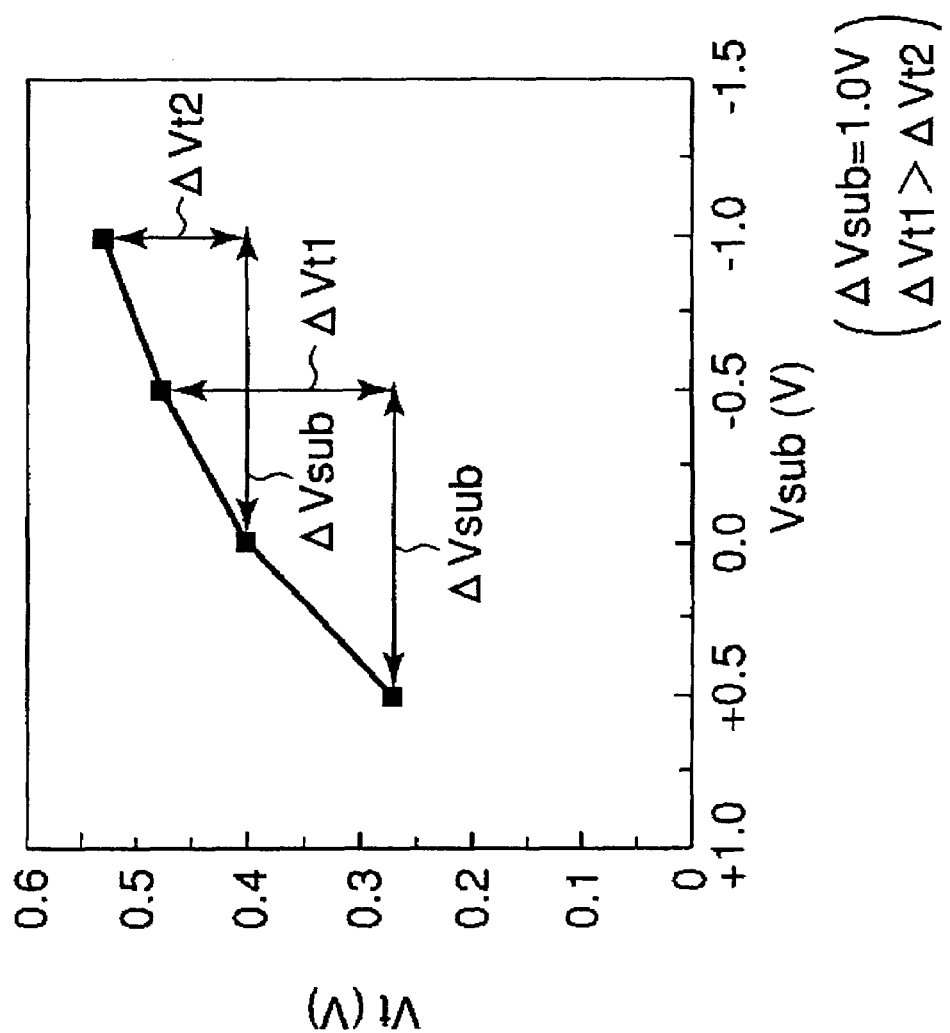
FIG. 15 is a diagram showing a relationship between a substrate voltage Vsub and a threshold voltage Vth in case a width of FIN is large.

Next, in accordance with FIGS. 13 and 14, descriptions will be provided for the Id-Vg characteristics of FinFETs having the same gate length but different fin widths.

FIG. 13 shows the Id-Vg which is observed in a case where a FinFET formed on a bulk substrate has a narrow fin width Wfin (for example, the fin width Wfin is approximately 50 nm), and concurrently where the substrate voltage Vsub of the substrate bias generating circuit 55 is changed from the ground voltage (0V) to a negative voltage or from the ground voltage (0V) to a positive voltage (−0.1V<Vsub<0.5V).

A continuous line 33-0 in FIG. 13 denotes a characteristic curve which is obtained in a case where the substrate voltage Vsub is equal to the ground voltage (0V). Continuous lines 33-1 denote a characteristic curve which is obtained in a case where the substrate voltage Vsub is a negative voltage (Vsub is equal to −0.5V), and a characteristic curve which is obtained in a case where the substrate voltage Vsub is another negative voltage (Vsub is equal to −1.0V). Continuous lines 33-2 denote a characteristic curve which is obtained in a case where the substrate voltage Vsub is a positive voltage (Vsub is equal to 1.0V), and a characteristic curve which is obtained in a case where the substrate voltage Vsub is another positive voltage (Vsub is equal to 1.5V).

As illustrated, in the case where the fin width Wfin is narrow, even when the substrate voltage Vsub is changed (−1.0V<Vsub<0.5V), almost no change is observed in the threshold voltage Vt.

In a case where, for example, the drain current Id is 10−7 (A) (Id=10−7 (A)), even when the substrate voltage Vsub is changed, almost no change is observed in the threshold voltage Vt(V). The threshold voltage Vt(V) is approximately −0.2V.

As described above, in the case where the fin width Wfin is narrow, the threshold voltage Vt is almost insusceptible to the substrate voltage Vsub. As a result, the operation mode of the FinFET is almost equivalent to that of a fully-depleted SOI MOSFET (FD-SOI MOSFET).

On the other hand, FIG. 14 shows the Id-Vg characteristic which is observed in a case where a FinFET formed on a bulk substrate has a wide fin width Wfin (for example, the fin width Wfin=approximately 100 nm), and concurrently where the substrate voltage Vsub of the substrate bias generating circuit 55 is changed from the ground voltage (0V) to the negative voltage or from the ground voltage (0V) to the positive voltage (−1.0V<Vsub<0.5V).

Similarly, a continuous line 33-0 in FIG. 14 denotes the characteristic curve which is obtained in a case where the substrate voltage Vsub is equal to the ground voltage (0V). Continuous lines 33-1 denote a characteristic curve which is obtained in a case where the substrate voltage Vsub is a negative voltage (Vsub is equal to −0.5V), and a characteristic curve which is obtained in a case where the substrate voltage Vsub is another negative voltage (Vsub is equal to −1.0V).

Continuous lines 33-2 denote a characteristic curve which is obtained in a case where the substrate voltage Vsub is a positive voltage (Vsub is equal to 1.0V), and a characteristic curve which is obtained in a case where the substrate voltage Vsub is another positive voltage (Vsub is equal to 1.5V).

As illustrated, it is learned that, in the case where the FinFET has the wide fin width Wfin, when the substrate voltage Vsub is changed (−1.0V<Vsub<0.5V), the threshold voltage Vt is accordingly changed. In a case where, for example, the drain current Id is 10−7(A) (Id=10−7(A)), the range of change in the threshold voltage ΔVt is approximately 0.25V to 0.41V.

In a case where a negative substrate voltage Vsub is applied to the FinFET to which the ground voltage has been applied (in a case represented by the characteristic curve 33-1), the Id-Vg curve is capable of being shifted so that the threshold voltage Vt can be increased (so that the current driving capability Itr can be decreased).

By contrast, in a case where a positive substrate voltage Vsub is applied to the FinFET to which the ground voltage has been applied (in a case represented by the characteristic curve 33-2), the Id-Vg curve is capable of being shifted so that the threshold voltage Vt can be decreased (so that the current driving capability Itr can be increased).

As described above, in the case where the FinFET formed on the bulk substrate has the wide fin width Wfin, the threshold voltage Vt is controlled in accordance with the substrate voltage Vsub. For this reason, this FinFET is electrically equivalent to two regular bulk transistors (bulk MOSFET) formed respectively at the two sides of the pillar (FIN). This can be assumed as a condition in which, although a depletion layer formed when a voltage is applied to the top gate extends from the top gate whereas a depletion layer formed when the voltage is applied to the back gate extends from the back gate, the two depletion layers are not connected to each other.

This assumption is explained by the fact that the threshold voltage Vt of the FinFET with the wider fin width which operates as a partially-depleted SOI MOSFET (PD-SOI MOSFET) (FIG. 14) is larger than the threshold voltage Vt of the FinFET with the narrower fin width which operates as a fully-depleted SOI MOSFET (FD-SOI MOSFET) (FIG. 13).

This indicates that the threshold voltage Vt of the FinFET with the wider fin width is controlled by applying the substrate voltage Vsub to the FinFET.

In the case of the present example, the operation mode of each of the transfer transistors N5 and N6 is equivalent to that of a partially-depleted SOI MOSFET (in the case shown in FIG. 14), because the transfer transistors N5 and N6 have a wider fin width Wfin1. For this reason, by causing the substrate bias generating circuit 55 to apply a negative substrate voltage Vsub to the transfer transistors N5 and N6, it is possible to increase the threshold voltages Vt of the transfer transistors N5 and N6, and to accordingly decrease the current driving capabilities Itr (N5) and Itr (N6). Since it is possible to decrease the current driving capabilities Itr (N5) and Itr (N6) constituting the denominator components of the respective β ratios in this manner, it is accordingly possible to increase the β ratio β2 according to the present example.

The substrate voltage Vsub is applied to the well regions (p-wells) of the respective transfer transistors N5 and N6 via a contact interconnect (not illustrated in FIG. 12) in the semiconductor substrate 21 on which the transfer transistors N5 and N6 are provided.

On the other hand, the fin widths Wfin2 respectively of the driver transistors N3 and N4 as well as the load transistors P1 and P2 according to the present example are set narrower. For this reason, the operation mode of each of the driver transistors N3 and N4 as well as the load transistors P1 and P2 is equivalent to that of a fully-depleted SOI MOSFET (in the case shown in FIG. 13. As a result, even when the substrate bias generating circuit 55 applies a positive or negative substrate voltage Vsub to the driver transistors N3 and N4 as well as the load transistors P1 and P2, their threshold voltages Vt do not change. Consequently, even in a case where the substrate voltage Vsub is applied to the driver transistors N3 and N4 as well as the load transistors P1 and P2, it is possible to prevent change in the current driving capabilities Idr (N3), Idr (N4), Pld (P1) and Pld (P2) respectively of the driver transistors N3 and N4 as well as the load transistors P1 and P2.

Descriptions will be provided next for a relationship between the threshold voltage Vt and the substrate voltage Vsub which is observed in a case where the FinFET has a wide fin width (Wfin is approximately 100 nm).

As illustrated, the threshold voltage Vt changes nonlinearly with respect to the substrate voltage Vsub. As a result, the range of change in the threshold voltage Vt is unproportional to the range of change in the substrate voltage Vsub. For example, the range of change in the threshold voltage ΔVt1 with respect to the range of change in the substrate voltage ΔVsub from +0.5V to −0.5V is larger than the range of change in the threshold voltage ΔVt2 with respect to the range of change in the substrate voltage ΔVsub from 0.0V to −0.1V (ΔVt1>ΔVt2), although both Δsub from +0.5V to −0.5V and Vsub from 0.0V to −0.1V are 1.0V.

As described above, the range of change in the threshold voltage is different from one another with an equal range of change in the substrate voltage Vsub. With this taken into consideration, it is desirable that the substrate bias generating circuit 55 may apply, to the driver transistors N3 and N4 as well as the load transistors P1 and P2, a substrate voltage Vsub in a range which makes the range of change in the threshold voltages Vt of the driver transistors N3 and N4 as well as the load transistors P1 and P2 larger (−0.5V<Vsub<+0.5V).

<β Ratio>

The β ratio β2 of the SRAM cell 10 according to the present example is expressed as:

$$\beta 2 = Idr\ (N3)/Itr\ (N5)$$
$$Idr\ (N4)/Itr\ (N6)$$

Here, the SRAM cell 10 according to the present example is summarized as shown in FIG. 16. As shown by the table in FIG. 16, the current driving capabilities Itr (N5) and Itr (N6) constituting the denominator components of the β ratios β2 decrease when the short channel effect deteriorates, because the gate length L1 is long (L1>L2), and because the number of pillars is one (×1).

Furthermore, since the fin width Wfin1 of the transfer transistors N5 and N6 is wide (Wfin1>Wfin2), the operation mode of each of the transfer transistors N5 and N6 is equivalent to that of a partially-depleted SOI MOSFET. For this reason, by causing the substrate bias generating circuit 55 to apply a negative substrate voltage Vsub to the transfer transistors N5 and N6, it is possible to increase the threshold voltages Vt of the transfer transistors N5 and N6, and to accordingly decrease the current driving capabilities Itr (N5) and Itr (N6).

On the other hand, the current driving capabilities Idr (N3) and Idr (N4) constituting the numerator components of the β ratios β2 increase, because the gate length L2 is short, and because the number of pillars is two.

Moreover, since the fin width Wfin2 of the driver transistors N3 and N4 is narrow (Wfin2<Wfin1), the operation mode of each of the driver transistors N3 and N4 is equivalent to that of a fully-depleted SOI MOSFET. For this reason, even if the substrate bias generating circuit 55 applies the substrate voltage Vsub to the driver transistors N3 and N4, the transistor characteristic of each of the driver transistors N3 and N4 does not change, and accordingly the threshold voltage Vt of each of the transistors N3 and N4 does not change. As a result, it is possible to prevent the current driving capabilities Idr (N3) and Idr (N4) from decreasing.

Consequently, for example, the β ratio β2 in the present example can be not less than 2.0. That is because, in the present example, the number of pillars FIN each of the driver transistors N3 and N4 has is two. As a matter of form, the β ratio is determined by how many channels each of the driver transistors N3 and N4 has.

The β ratio is determined by the number of channels, as described above. As a matter of form, the β ratio accordingly takes on nothing but an integer. In the case of the present example, however, it is possible to decrease the current driving capabilities Itr (N5) and Itr (N6) of the transfer transistors N5 and N6, which constitute the denominator components of the β ratios β2, by also applying a negative substrate voltage Vsub to the transfer transistors N5 and N6. As a result, it is possible to acquire the β ratio which is not less than 2.0. In addition, by selecting a value of the substrate voltage Vsub to be applied by the substrate bias generating circuit 55, it is possible to select a more optimal value for the β ratio.

As described above, the semiconductor memory device according to this embodiment brings about an effect which is the same as the effect (1) which has been described.

(1) the semiconductor memory device according to this embodiment is capable of increasing the β ratio, and of accordingly improving the SNM. This is advantageous for the stable operation of the semiconductor memory device.

The semiconductor memory device according to the present example includes the substrate bias generating circuit 55 for applying a substrate voltage Vsub to the well regions of the respective transfer transistors N5 and N6.

Furthermore, as shown in FIG. 12, the gate length L1 of the transfer transistors N5 and N6 is long, and the number of pillars of each of the transfer transistors is one. For this reason, it is possible to decrease the current driving capabilities Itr (N5) and Itr (N6) constituting the denominator components of the β ratios β2.

Moreover, since the fin width Wfin1 of the transfer transistors N5 and N6 is wide (Wfin1>Wfin2), the operation mode of each of the transfer transistors N5 and N6 is equivalent to that of a partially-depleted SOI MOSFET. For this reason, by causing the substrate bias generating circuit 55 to apply a negative substrate voltage Vsub to the transfer transistors N5 and N6, it is possible to increase the threshold voltages Vt of the transfer transistors N5 and N6, and to accordingly decrease the current driving capabilities Itr (N5) and Itr (N6).

On the other hand, the gate length L2 of the driver transistors N3 and N4 is short, and the number of pillars of each of the driver transistors N3 and N4 is two. For this reason, it is possible to increase the current driving capabilities Idr (N3) and Idr (N4) constituting the numerator components of the β ratios β2.

In addition, since the fin width Wfin2 of the driver transistors N3 and N4 is narrow, the operation mode of each of the driver transistors N3 and N4 is equivalent to that of a fully-depleted SOI MOSFET. As a result, even if the substrate bias generating circuit 55 applies a substrate voltage Vsub to the driver transistors N3 and N4, the transistor characteristic of each of the driver transistors N3 and N4 does not change, and thus the threshold voltages Vt thereof does not change. Accordingly, it is possible to prevent the current driving capabilities Idr (N3) and Idr (N4) from decreasing.

Consequently, the semiconductor memory device according to the present embodiment is capable of increasing the β ratio β2, and of accordingly improving the SNM. This is advantageous for the stable operation of the semiconductor memory device.

Moreover, the semiconductor memory device according to the present example brings about the effect (2) which has been described, while leaving the height of the pillars FIN unchanged. In this point, the semiconductor memory device is advantageous in a case where the transistors of the SRAM cell 10 are configured of FinFETs.

It may be noted that, in the case of the second embodiment, the well regions (for example, p-wells) respectively of the driver transistors N3 and N4 as well as the transfer transistors N5 and N6 may be commonly shared among the driver transistors N3 and N4 as well as the transfer transistors N5 and N6, and may be electrically connected to one another. Otherwise, the well regions respectively of the driver transistors N3 and N4 as well as the transfer transistors N5 and N6 may be independent of one another, and may be electrically disconnected to one another. Whether the well regions respectively of the driver transistors N3 and N4 as well as the transfer transistors N5 and N6 may be electrically connected or disconnected to one another, it is only in the transfer transistors N5 and N6 that the threshold voltage changes when the substrate voltage Vsub is applied to the well regions. For this reason, whether the well regions may be electrically connected or disconnected to one another, the current characteristic of each of the driver transistors N3 and N4 does not change, and it is accordingly possible to keep the current driving capabilities Idr (N3) and Idr (N4) constant. As a result, whether the well regions may be electrically connected or disconnected to one another in terms of the layout, it is possible to improve the SNM.

First Modification of First Embodiment

Modified Example 2 (Example of Semiconductor Memory Device in which Substrate Voltage Vsub is of Pulse Driving Type) will be explained hereinafter.

Figure 17:
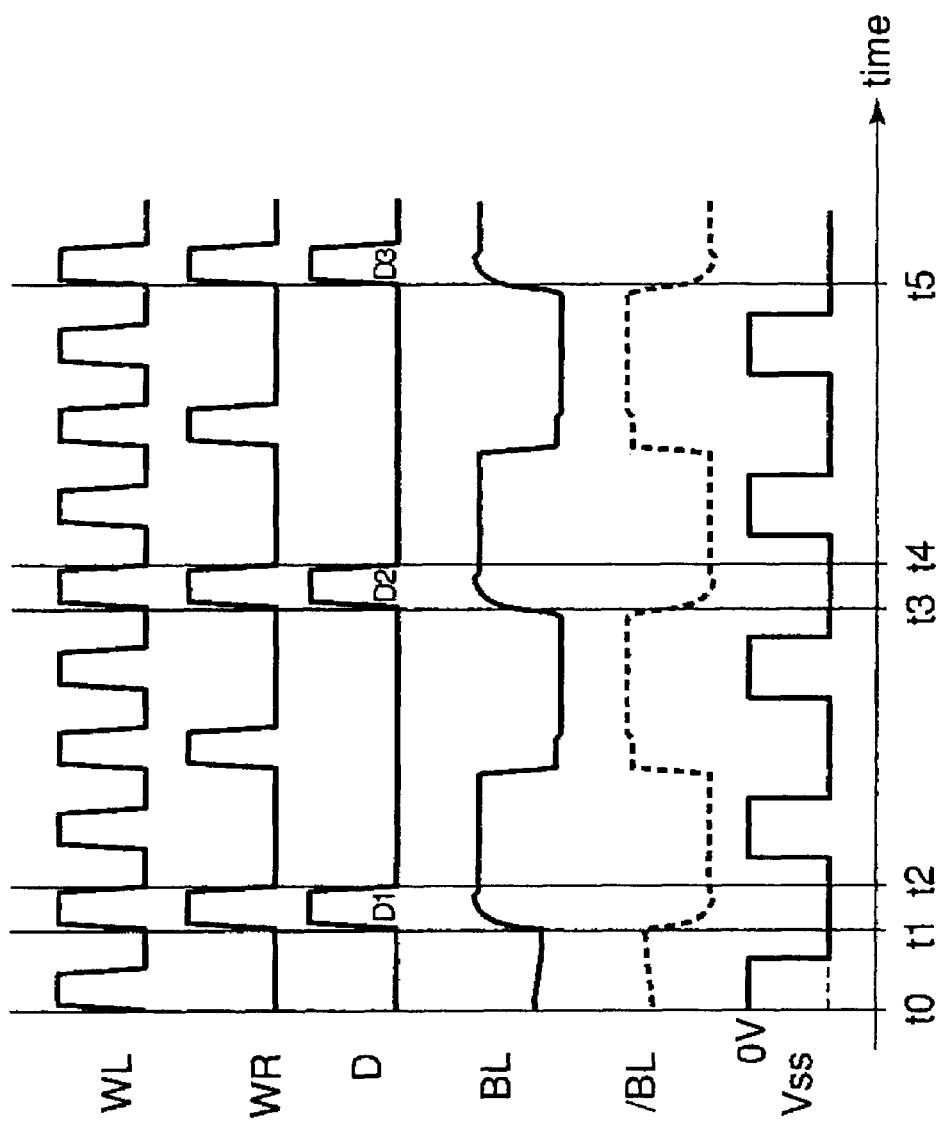
FIG. 17 is a timing chart of a semiconductor memory device in accordance with a first modification of the second embodiment.
Figure 18:
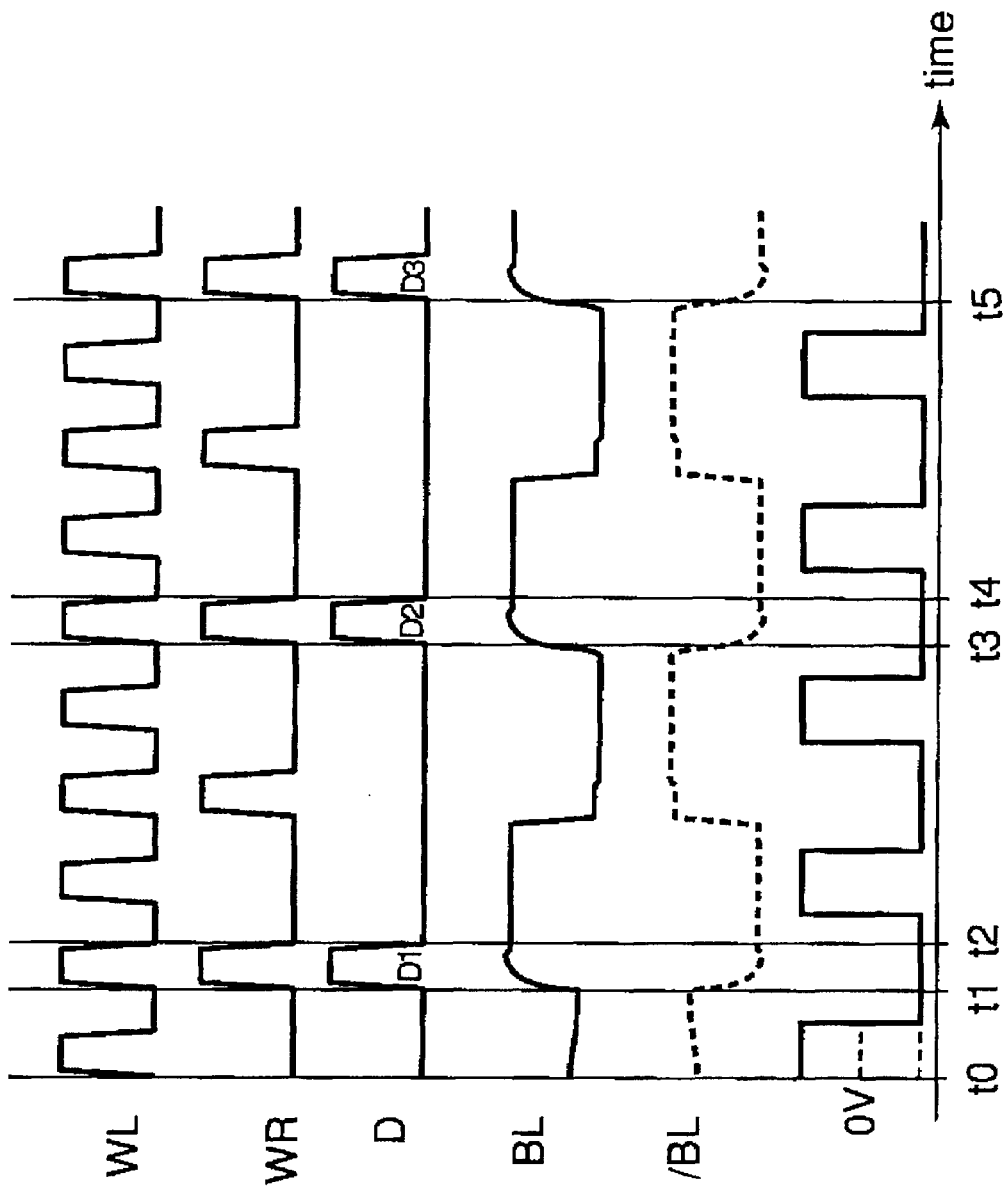
FIG. 18 is a timing chart a timing chart of the semiconductor memory device in accordance with the first modification of the second embodiment.

Descriptions will be provided next for a semiconductor memory device according to Modified Example 2 in accordance with FIGS. 17 and 18. Modified Example 2 is concerned with timings of application of the substrate voltage Vsub. Descriptions will be provided for Modified Example 2 while omitting detailed descriptions which are the same as those for the second embodiment.

As shown in FIG. 17, First, the substrate bias generating circuit 55 applies a negative substrate voltage Vsub, changed from the ground voltage (0V), to the well regions of the respective transfer transistors N5 and N6 immediately before time t1.

Subsequently, once the SRAM cell 10 receives a write enable signal WR and input data D1 at time t1, the SRAM cell 10 goes into a stand-by mode. Thereafter, the SRAM cell 10 operates the transfer transistors N5 and N6, and thus causes the input data D1 to be latched by the inverter circuits 12-1 and 12-2 connected as a flip-flop, hence starting a write operation.

Afterward, the SRAM cell 10 completes carrying out the write operation of writing the input data D1 at time t2.

Subsequently, the substrate bias generating circuit 55 returns the substrate voltage Vsub from the negative voltage to the ground voltage (0V).

After that, the SRAM cell 10 repeats carrying out the same operations, and thus performs the same write operation on data D2 and data D3.

In this manner, by applying the negative substrate voltage Vsub to the well regions of the respective transfer transistors immediately before the write enable signal WR and the input data D are received by the SRAM cell 10, the substrate bias generating circuit 55 is capable of increasing the β ratio β2, and of accordingly improving the SNM, while carrying out the write operation. As described above, the timings at which the negative substrate voltage Vsub is applied to the well regions of the respective transfer transistors are times sufficiently but immediately before times t1, t3 and t5 at each of which the write enable signal WR and the corresponding input data D1, D2 or D3 are received by the SRAM cell 10. For this reason, each time the SRAM cell 10 comes out of the stand-by mode, the SRAM cell 10 is capable of writing the corresponding data D1, D2 or D3 with the current driving capabilities Itr (N5) and Itr (N6) of the transfer transistors N5 and N6 decreased.

In addition, each time the write enable signal WR and the input data D fall, the substrate bias generating circuit 55 returns the substrate voltage Vsub to 0V, which is the ground voltage GND, immediately after the fall. In this manner, timings at which the substrate bias generating circuit 55 returns the substrate voltage Vsub to the ground voltage GND are time sufficiently but immediately after times t2, t4 and t6 at each of which the write enable signal WR and the corresponding input data D1, D2 or D3 fall. For this reason, each time the SRAM cell 10 completes carrying out a write operation, the substrate voltage generating circuit 55 decreases the threshold voltages Vt of the respective transfer transistors N5 and N6, and thus increases the current driving capabilities Itr (N5) and Itr (N6).

This scheme makes it possible to improve the current characteristic of each of the transfer transistors N5 and N6 each time a read operation is performed, and to accordingly increase the reading speed.

In the case where the substrate voltage Vsub is of the pulse driving type in this manner, it is desirable that, as described above, the substrate voltage Vsub may be applied to the well regions of the respective transfer transistors at its predetermined timings.

<Example of Semiconductor Memory Device in which Substrate Voltage is Changed to Positive and Negative>

In the case where the substrate voltage Vsub is of the pulse driving type, the substrate voltage Vsub can be changed as shown in FIG. 18. The substrate voltage Vsub in the present example is different from the substrate voltage Vsub shown in FIG. 17 in that, when a write operation is performed, the substrate voltage Vsub is changed from a negative voltage to a positive voltage, or from a positive voltage to a negative voltage, instead of between a negative voltage and 0V, which is the ground-level voltage.

In this case, the semiconductor memory device is effective for making it possible to increase the reading speed of each of the transfer transistors N5 and N6 when a read operation is performed.

A reason for this is as follows. As illustrated, after a write operation is performed, the substrate bias generating circuit 55 makes it possible to further decrease the threshold voltages Vt of the respective transfer transistors N5 and N6 by applying a positive substrate voltage Vsub to the transfer transistors N5 and N6. As a result, it is possible to improve the current characteristic of each of the transfer transistors N5 and N6, and to accordingly increase the current driving capabilities Itr (N5) and Itr (N6) when a read operation is performed.

Furthermore, in a case where the transfer transistors N5 and N6 are configured of FinFETs, the semiconductor memory device brings about an effect which is substantially the same as the effect which is obtained when the threshold voltages Vt of the respective transfer transistors N5 and N6 are increased. The semiconductor memory device according to the present example is advantageous in the case where the transfer transistors N5 and N6 are configured of FinFETs.

Second Modification of First Embodiment

Modified Example 3 (Example of Plane Layout or the Like) will be explained hereinafter.

Figure 19:
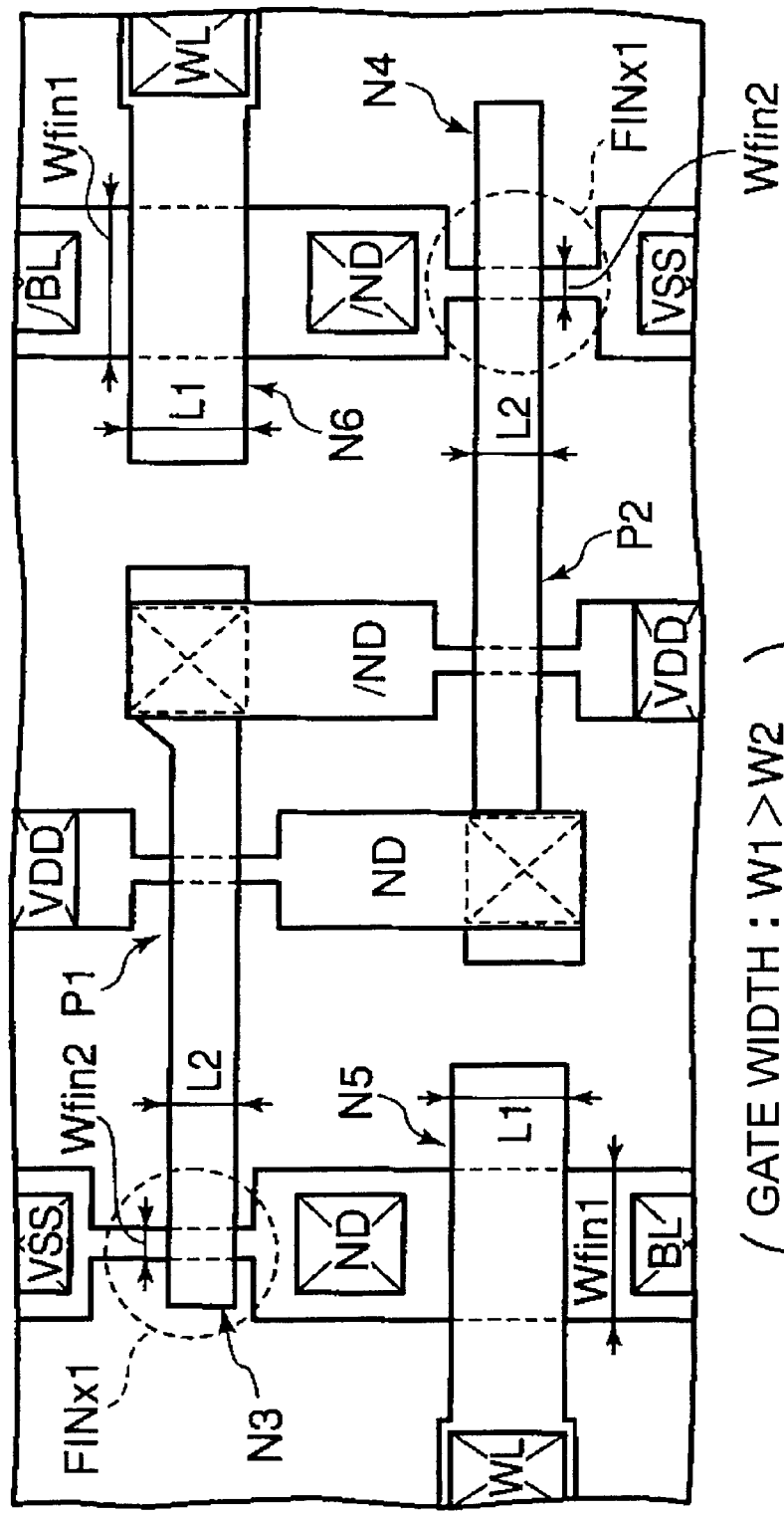
FIG. 19 is a schematic plan layout of a SRAM cell as a semiconductor memory device in accordance with a second modification of the second embodiment.

Descriptions will be provided next for a semiconductor memory device according to Modified Example 3 in accordance with FIGS. 19 and 20. Modified Example 3 is concerned with an example of the plane layout or the like of the second embodiment. Descriptions will be provided for the semiconductor memory device according to Modified Example 3 while omitting detailed descriptions which are the same as those for the second embodiment.

The semiconductor memory device according to Modified Example 3 is different from the semiconductor memory device according to the second embodiment in that, as illustrated, the number of pillars of each of the driver transistors N3 and N4 as well as the load transistors P1 and P2 is one (FIN×1).

For this reason, as a matter of form, the β ratio β3 of the SRAM cell 10 according to the present modified example can take on a value which is not less than 1.0.

In general, it is optimal that the β ratio may be approximately 1.5 to 2.5. With this taken into consideration, the semiconductor memory device according to Modified Example 3 is effective, since it is possible to select an optimal β ratio β3, which is, for example, 1.0 to 2.5, by selecting a value of the substrate voltage Vsub applied by the substrate bias generating circuit 55 depending on the necessity.

Even the semiconductor memory device according to Modified Example 3 can bring about an effect which is the same as that brought about by the semiconductor memory device according to the second embodiment, by having the substrate voltage Vsub applied at predetermined timings.

It may be noted that, in the case of the first and second embodiments and Modified Examples 1 to 3, the transistors constituting the SRAM cell 10 are not limited to FinFETs. For example, double-gate planar transistors, single-gate planar transistors and the like are similarly applicable to the transistors of the SRAM cell 10, and can bring about an effect which is the same as the effect (1) which has been discussed above.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
   a SRAM cell having a first inverter, a second inverter, a first transfer transistor and a second transfer transistor, the first inverter having a first load transistor and a first driver transistor connected to the first load transistor, the second inverter having a second load transistor and a second driver transistor connected to the second load transistor,
   a voltage supplying circuit configured to supply a voltage to a well region of the first transfer transistor and a well region of the second transfer transistor, the voltage being one of more than a GND voltage and less than a GND voltage
   wherein the voltage supplying circuit is configured to supply a voltage which is less than a GND voltage to the well region of the first transfer transistor and the well region of the second transfer transistor when data is started to be written to the SRAM cell.

2. A semiconductor device of claim 1, wherein the first transfer transistor, the second transfer transistor, the first driver transistor and the second driver transistor are Fin transistors,
   a gate length of the first transfer transistor and a gate length of the second transfer transistor are greater than a gate length of the first driver transistor and a gate length of the second driver transistor,
   a fin width of the first transfer transistor and a fin width of the second transfer transistor are greater than a fin width of the first driver transistor and a fin width of the second driver transistor, and
   the number of fins of the first driver transistor is two and the number of fins of the second driver transistor is two.

3. A semiconductor device of claim 1, wherein the voltage supplying circuit is configured to supply a voltage which is equal to or more than a GND voltage to the well region of the first transfer transistor and the well region of the second transfer transistor, after finishing writing of the data to the SRAM cell.

4. A semiconductor device of claim 2, wherein the voltage supplying circuit is configured to supply a voltage which is equal to or more than a GND voltage to the well region of the first transfer transistor and the well region of the second transfer transistor, after finishing writing of the data to the SRAM cell.

* * * * *